US012787666B2

(12) United States Patent
(10) Patent No.: US 12,787,666 B2
(45) Date of Patent: Nov. 3, 2026

Miyata et al.

(54) PROCESSING METHOD, METHOD OF MANUFACTURING SEMICONDUCTOR DEVICE, PROCESSING APPARATUS, AND RECORDING MEDIUM

(71) Applicant: Kokusai Electric Corporation, Tokyo (JP)

(72) Inventors: Shoma Miyata, Toyama (JP); Kimihiko Nakatani, Toyama (JP); Takayuki Waseda, Toyama (JP); Yoshitomo Hashimoto, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 351 days.

(21) Appl. No.: 18/480,719

(22) Filed: Oct. 4, 2023

(65) Prior Publication Data

US 2024/0030026 A1 Jan. 25, 2024

Related U.S. Application Data

(63) Continuation of application No. PCT/JP2021/023275, filed on Jun. 18, 2021.

(51) Int. Cl.
*H10P 14/60* (2026.01)
*C23C 16/02* (2006.01)
(Continued)

(52) U.S. Cl.
CPC ...... *H10P 14/6506* (2026.01); *C23C 16/0272* (2013.01); *C23C 16/04* (2013.01);
(Continued)

(58) Field of Classification Search
CPC ............. H10P 14/6506; H10P 16/6334; H10P 14/6922; C23C 16/0272; C23C 16/04
See application file for complete search history.

(56) References Cited

U.S. PATENT DOCUMENTS

2020/0006057 A1* 1/2020 Azumo ............... H10P 14/6939
2021/0035801 A1 2/2021 Waseda et al.
(Continued)

FOREIGN PATENT DOCUMENTS

JP 2020-002452 A 1/2020
JP 2021-027067 A 2/2021
(Continued)

OTHER PUBLICATIONS

Korean Office Action issued on Apr. 9, 2025 for Korean Patent Application No. 10-2023-7032429.
(Continued)

*Primary Examiner* — Nathan T Leong
(74) *Attorney, Agent, or Firm* — Volpe Koenig

(57) ABSTRACT

There is provided a technique that includes (a) forming a first adsorption-inhibiting layer by adsorbing at least a portion of a molecular structure of molecules constituting a first precursor on a surface of a first base by supplying the first precursor to a substrate including the first base and a second base on a surface of the substrate, (b) forming an adsorption-promoting layer on a surface of the second base by supplying a reactant to the substrate, (c) forming a second adsorption-inhibiting layer by adsorbing at least a portion of a molecular structure of molecules constituting a second precursor on a surface of the adsorption-promoting layer by supplying the second precursor, which is different in molecular structure from the first precursor, to the substrate, and (d) forming a film on the surface of the first base by supplying a film-forming substance to the substrate subjected to (a), (b), and (c).

21 Claims, 13 Drawing Sheets

(51) Int. Cl.

| | |
|---|---|
| ***C23C 16/04*** | (2006.01) |
| ***C23C 16/32*** | (2006.01) |
| ***C23C 16/56*** | (2006.01) |
| ***H10P 14/692*** | (2026.01) |

(52) U.S. Cl.

CPC ............ *C23C 16/325* (2013.01); *C23C 16/56* (2013.01); *H10P 14/6334* (2026.01); *H10P 14/6922* (2026.01)

(56) References Cited

U.S. PATENT DOCUMENTS

| | | | |
|---|---|---|---|
| 2021/0143001 | A1 | 5/2021 | Ashihara et al. |
| 2021/0166948 | A1 | 6/2021 | Degai et al. |
| 2022/0005685 | A1 | 1/2022 | Degai et al. |
| 2022/0277955 | A1 | 9/2022 | Waseda et al. |

FOREIGN PATENT DOCUMENTS

| | | | |
|---|---|---|---|
| KR | 10-2020-0004245 | A | 1/2020 |
| TW | 202014547 | A | 4/2020 |
| WO | 2020/016914 | A1 | 1/2020 |
| WO | 2020/016915 | A1 | 1/2020 |
| WO | 2020/188801 | A1 | 9/2020 |

OTHER PUBLICATIONS

Taiwan Office Action for Application No. 111116895 with English Translation, 9 pages.

International Search Report with English Translation, PCT/JP2021/023275, Sep. 7, 2021, 5 pgs.

Singapore Written Opinion issued on Aug. 17, 2026, for Singapore Patent Application No. 11202309648Q.

* cited by examiner

PROCESSING METHOD, METHOD OF MANUFACTURING SEMICONDUCTOR DEVICE, PROCESSING APPARATUS, AND RECORDING MEDIUM

CROSS-REFERENCE TO RELATED APPLICATION

This application is a Bypass Continuation Application of PCT International Application No. PCT/JP2021/023275, filed on Jun. 18, 2021, the entire contents of which are incorporated herein by reference.

TECHNICAL FIELD

The present disclosure relates to a processing method, a method of manufacturing a semiconductor device, a processing apparatus, and a recording medium.

BACKGROUND OF THE INVENTION

With a scaling of semiconductor devices, processing dimensions are becoming finer and processes are becoming more complicated. In order to perform fine and complicated processing, it is necessary to repeat a high-precision patterning process many times, which leads to an increase in costs in semiconductor device manufacture. In recent years, selective growth has been attracting attention as a method that can be expected to provide high precision and cost reduction. The selective growth is a technique for forming a film by selectively growing the film on a surface of a desired base from among two or more types of bases exposed on the surface of a substrate.

In the selective growth, an adsorption-inhibiting layer may be formed on a surface of a base on which the film is not desired to grow. However, it may be difficult to form the adsorption-inhibiting layer on the surface of the specific base.

SUMMARY OF THE INVENTION

Some embodiments of the present disclosure provide a technique capable of selectively forming a film on a surface of a desired base by selectively forming an adsorption-inhibiting layer on a surface of a specific base.

According to one embodiment of the present disclosure, there is provided a technique that includes (a) forming a first adsorption-inhibiting layer by adsorbing at least a portion of a molecular structure of molecules constituting a first precursor on a surface of a first base by supplying the first precursor to a substrate including the first base and a second base on a surface of the substrate, (b) forming an adsorption-promoting layer on a surface of the second base by supplying a reactant to the substrate, (c) forming a second adsorption-inhibiting layer by adsorbing at least a portion of a molecular structure of molecules constituting a second precursor on a surface of the adsorption-promoting layer by supplying the second precursor, which is different in molecular structure from the first precursor, to the substrate, and (d) forming a film on the surface of the first base by supplying a film-forming substance to the substrate subjected to (a), (b), and (c).

BRIEF DESCRIPTION OF DRAWINGS

The accompanying drawings, which are incorporated in and constitute a part of the specification, illustrate embodiments of the present disclosure.

FIG. 4A is a schematic cross-sectional view showing the surface portion of the wafer where a silicon oxide film (SiO film) as a first base and a silicon nitride film (SiN film) as a second base are exposed.

FIG. 4B is a schematic cross-sectional view showing the surface portion of the wafer after forming a first adsorption-inhibiting layer on a surface of the SiO film by performing step A.

FIG. 4C is a schematic cross-sectional view showing the surface portion of the wafer after forming an adsorption-promoting layer on a surface of the SiN film by performing step B.

FIG. 4D is a schematic cross-sectional view showing the surface portion of the wafer after forming a second adsorption-inhibiting layer on a surface of the adsorption-promoting layer by performing step C.

FIG. 4E is a schematic cross-sectional view showing the surface portion of the wafer after forming a film on the surface of the SiO film by performing step D from a state of FIG. 4D.

FIGS. 5A to 5D are views similar to FIGS. 4A to 4D.

FIG. 5E is a schematic cross-sectional view showing the surface portion of the wafer after removing the first adsorption-inhibiting layer from the surface of the SiO film by performing step E.

FIG. 5F is a schematic cross-sectional view showing the surface portion of the wafer after forming a film on the surface of the SiO film by performing step D from a state of FIG. 5E.

FIGS. 6A to 6D are views similar to FIGS. 4A to 4D.

FIG. 6E is a schematic cross-sectional view showing the surface portion of the wafer after invalidating an action of the first adsorption-inhibiting layer by performing step E from a state of FIG. 6D.

FIG. 6F is a schematic cross-sectional view showing the surface portion of the wafer after forming the film on the surface of the SiO film by performing step D from a state of FIG. 6E.

FIG. 7A is a schematic cross-sectional view showing the surface portion of the wafer where a SiO film as a first base and a SiN film as a second base are exposed and showing adsorption sites on a surface of the SiO film.

FIG. 7B is a schematic cross-sectional view showing the surface portion of the wafer after reducing the adsorption sites on the surface of the SiO film by performing step F from a state of FIG. 7A.

FIG. 7C is a schematic cross-sectional view showing the surface portion of the wafer after forming a first adsorption-inhibiting layer on the surface of the SiO film by performing step A from a state of FIG. 7B.

FIGS. 7D to 7F are views similar to FIGS. 4C to 4E.

FIGS. 8A to 8D are views similar to FIGS. 4A to 4D.

FIG. 8E is a schematic cross-sectional view showing the surface portion of the wafer after forming a film different in material from the adsorption-promoting layer on the surface of the SiO film by performing step D from a state of FIG. 8D.

FIG. 8F is a schematic cross-sectional view showing the surface portion of the wafer after removing the adsorption-promoting layer and the second adsorption-inhibiting layer on the surface of the SiN film from the surface of the SiN film by performing step G from a state of FIG. 8E.

FIGS. 9A to 9D are views similar to FIGS. 4A to 4D.

FIG. 9E is a schematic cross-sectional view showing the surface portion of the wafer after forming a film different in material from the adsorption-promoting layer on the surface of the SiO film by performing step D from a state of FIG. 9D.

FIG. 9F is a schematic cross-sectional view showing the surface portion of the wafer after removing the adsorption-promoting layer and the second adsorption-inhibiting layer on the surface of the SiN film from the surface of the SiN film by performing step G from a state of FIG. 9E.

FIG. 9G is a schematic cross-sectional view showing the surface portion of the wafer after modifying the film formed on the surface of the SiO film by performing step H from a state of FIG. 9F to be changed to a (modified) film different in material from the film formed on the surface of the SiO film.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment of the Present Disclosure

A first embodiment of the present disclosure will now be described mainly with reference to FIGS. 1 to 3 and 4A to 4E. The drawings used in the following description are all schematic, and the dimensional relationship, ratios, and the like of various elements shown in figures do not always match the actual ones. Further, the dimensional relationship, ratios, and the like of various elements between plural figures do not always match each other.

(1) Configuration of Substrate Processing Apparatus

Figure 1:
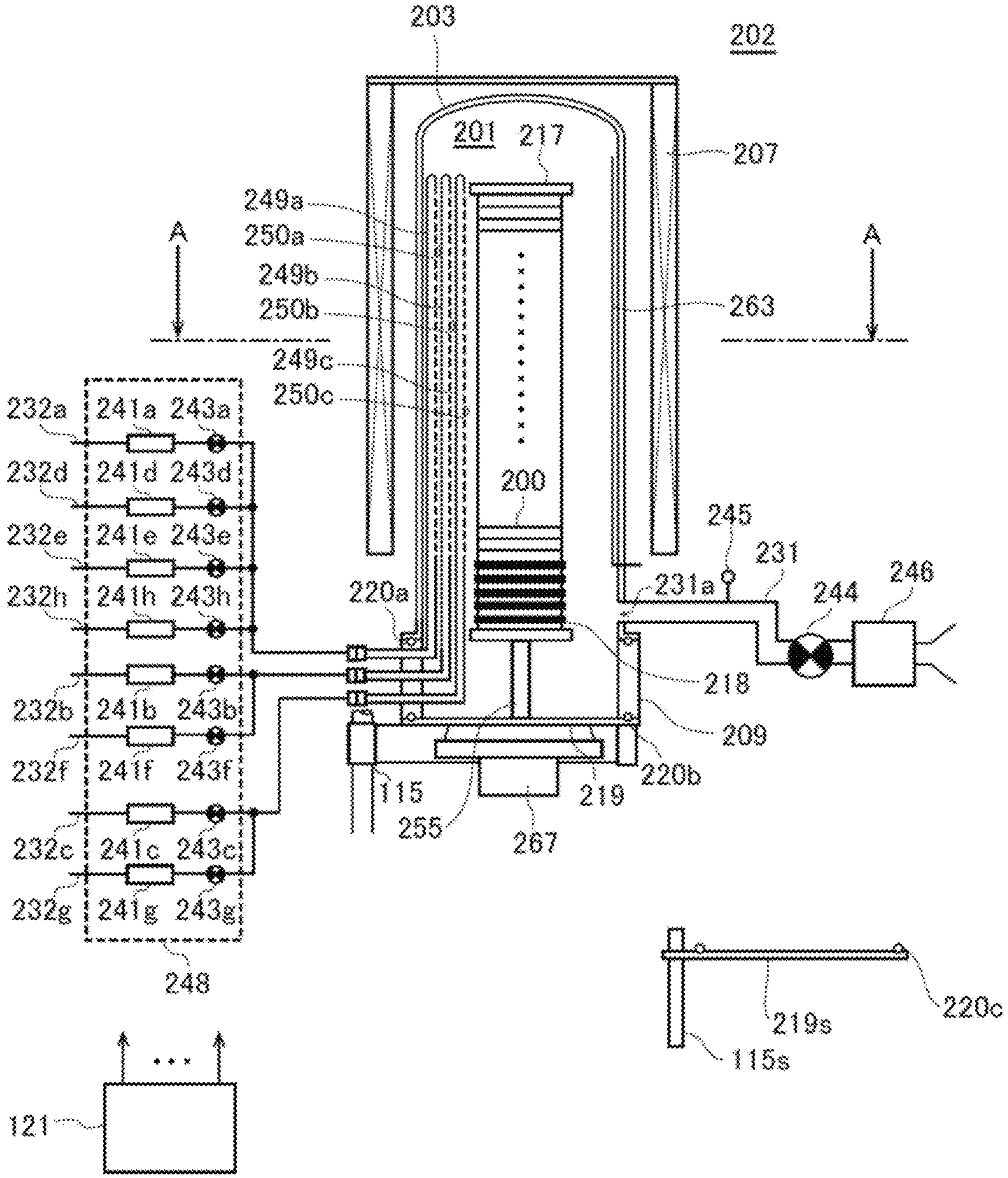
FIG. 1 is a schematic configuration view of a vertical process furnace of a substrate processing apparatus suitably used in an embodiment of the present disclosure, in which a portion of a process furnace is shown in a vertical cross section.

As shown in FIG. 1, a process furnace 202 includes a heater 207 as a temperature adjustor (a heating part). The heater 207 has a cylindrical shape and is supported by a support plate to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is made of, for example, a heat resistant material such as quartz ($SiO_2$), silicon carbide (SiC), or the like, and has a cylindrical shape with its upper end closed and its lower end opened. A manifold 209 is disposed to be concentric with the reaction tube 203 under the reaction tube 203. The manifold 209 is made of, for example, a metal material such as stainless steel (SUS) or the like, and has a cylindrical shape with both of its upper and lower ends opened. An upper end portion of the manifold 209 engages with a lower end portion of the reaction tube 203 to support the reaction tube 203. An O-ring 220*a* serving as a seal member is installed between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 is configured to accommodate a plurality of wafers 200 as substrates. Processing on the wafers 200 is performed in the process chamber 201.

Nozzles 249*a* to 249*c* as first to third supply parts are installed in the process chamber 201 to penetrate through a sidewall of the manifold 209. The nozzles 249*a* to 249*c* are also referred to as first to third nozzles, respectively. The nozzles 249*a* to 249*c* are made of, for example, a heat resistant material such as quartz, SiC, or the like. Gas supply pipes 232*a* to 232*c* are connected to the nozzles 249*a* to 249*c*, respectively. The nozzles 249*a* to 249*c* are different nozzles, and each of the nozzles 249*a* and 249*c* is installed adjacent to the nozzle 249*b*.

Mass flow controllers (MFCs) 241*a* to 241*c*, which are flow rate controllers (flow rate control parts), and valves 243*a* to 243*c*, which are opening/closing valves, are installed in the gas supply pipes 232*a* to 232*c*, respectively, sequentially from an upstream side of a gas flow. Each of gas supply pipes 232*d*, 232*e*, and 232*h* is connected to the gas supply pipe 232*a* at a downstream side of the valves 243*a*. Gas supply pipes 232*f* and 232*g* are connected to the gas supply pipes 232*b* and 232*c* at a downstream side of the valves 243*b* and 243*c*, respectively. MFCs 241*d* to 241*h* and valves 243*d* to 243*h* are installed in the gas supply pipes 232*d* to 232*h*, respectively, sequentially from an upstream side of a gas flow. The gas supply pipes 232*a* to 232*h* are made of, for example, a metal material such as SUS or the like.

Figure 2:
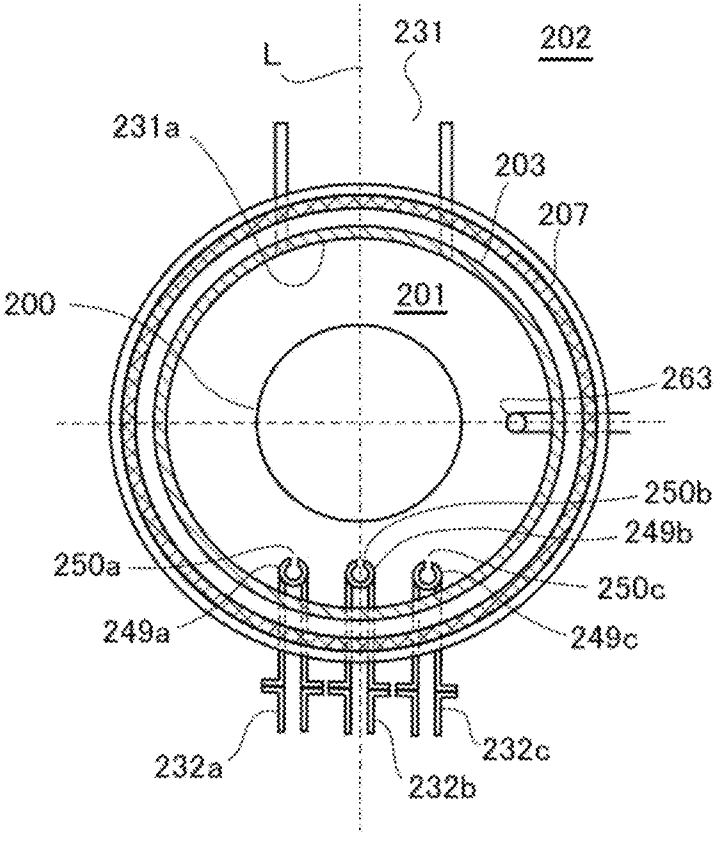
FIG. 2 is a schematic configuration view of the vertical process furnace of the substrate processing apparatus suitably used in the embodiment of the present disclosure, in which a portion of the process furnace is shown in a cross section taken along line A-A in FIG. 1.

As shown in FIG. 2, each of the nozzles 249*a* to 249*c* is installed in an annular space in a plane view between an inner wall of the reaction tube 203 and the wafers 200 to extend upward from a lower portion of the inner wall of the reaction tube 203 to an upper portion thereof, that is, along an arrangement direction of the wafers 200. Specifically, each of the nozzles 249*a* to 249*c* is installed in a region horizontally surrounding a wafer arrangement region in which the wafers 200 are arranged at a lateral side of the wafer arrangement region, along the wafer arrangement region. In the plane view, the nozzle 249*b* is disposed to face an exhaust port 231*a* to be described later on a straight line with centers of the wafers 200 loaded into the process chamber 201 that are interposed therebetween. The nozzles 249*a* and 249*c* are arranged to sandwich a straight line L passing through the nozzle 249*b* and a center of the exhaust port 231*a* between both sides along the inner wall (an outer peripheral portion of the wafers 200) of the reaction tube 203. The straight line L is also a straight line passing through the nozzle 249*b* and the centers of the wafers 200. That is, it can be said that the nozzle 249*c* is installed on a side opposite to the nozzle 249*a* with the straight line L interposed therebetween. The nozzles 249*a* and 249*c* are arranged in a line symmetry with the straight line L as an axis of symmetry. Gas supply holes 250*a* to 250*c* for supplying a gas are formed on side surfaces of the nozzles 249*a* to 249*c*, respectively. Each of the gas supply holes 250*a* to 250*c* is opened to oppose (face) the exhaust port 231*a* in the plane view that enables the gas to be supplied toward the wafers 200. A plurality of gas supply holes 250*a* to 250*c* are formed from the lower portion of the reaction tube 203 to the upper portion thereof.

A first precursor is supplied from the gas supply pipe 232*a* into the process chamber 201 through the MFC 241*a*, the valve 243*a*, and the nozzle 249*a*.

A second precursor is supplied from the gas supply pipe 232*h* into the process chamber 201 through the MFC 241*h*, the valve 243*h*, the gas supply pipe 232*a*, and the nozzle 249*a*.

A reactant is supplied from the gas supply pipe 232*b* into the process chamber 201 through the MFC 241*b*, the valve 243*b*, and the nozzle 249*b*.

A processing substance is supplied from the gas supply pipe 232*c* into the process chamber 201 through the MFC 241*c*, the valve 243*c*, and the nozzle 249*c*. The processing substance includes at least one selected from the group of a removing and/or an invalidating substance (hereinafter collectively referred to simply as an invalidating substance for the sake of convenience), an etching substance, and a modifying substance.

A film-forming substance is supplied from the gas supply pipe 232*d* into the process chamber 201 through the MFC 241*d*, the valve 243*d*, the gas supply pipe 232*a*, and the nozzle 249*a*.

An inert gas is supplied from the gas supply pipes 232*e* to 232*g* into the process chamber 201 through the MFCs 241*e* to 241*g*, the valves 243*e* to 243*g*, the gas supply pipes 232*a* to 232*c*, and the nozzles 249*a* to 249*c*, respectively. The inert gas acts as a purge gas, a carrier gas, a dilution gas, or the like.

A first precursor supply system mainly includes the gas supply pipe 232*a*, the MFC 241*a*, and the valve 243*a*. A second precursor supply system mainly includes the gas supply pipe 232*h*, the MFC 241*h*, and the valve 243*h*. The first precursor supply system and the second precursor supply system are also referred to as a precursor supply system. A reactant supply system mainly includes the gas supply pipe 232*b*, the MFC 241*b*, and the valve 243*b*. A processing substance supply system mainly includes the gas supply pipe 232*c*, the MFC 241*c*, and the valve 243*c*. In the case of supplying the invalidating substance, the etching substance, or the modifying substance as the processing substance, the processing substance supply system may be also referred to as an invalidating substance supply system, an etching substance supply system, or a modifying substance supply system according to the substance to be supplied. A film-forming substance supply system mainly includes the gas supply pipe 232*d*, the MFC 241*d*, and the valve 243*d*. An inert gas supply system mainly includes the gas supply pipes 232*e* to 232*g*, the MFCs 241*e* to 241*g*, and the valves 243*e* to 243*g*.

One or all of the above-described various supply systems may be configured as an integrated-type supply system 248 in which the valves 243*a* to 243*h*, the MFCs 241*a* to 241*h*, and so on are integrated. The integrated-type supply system 248 is connected to each of the gas supply pipes 232*a* to 232*h*. In addition, the integrated-type supply system 248 is configured such that operations of supplying various kinds of gases into the gas supply pipes 232*a* to 232*h* (that is, an opening/closing operation of the valves 243*a* to 243*h*, a flow rate adjustment operation by the MFCs 241*a* to 241*h*, and the like) are controlled by a controller 121 which will be described later. The integrated-type supply system 248 is configured as an integral type or detachable-type integrated unit, and may be attached to and detached from the gas supply pipes 232*a* to 232*h* and the like on an integrated unit basis, so maintenance, replacement, extension, etc. of the integrated-type supply system 248 can be performed on the integrated unit basis.

The exhaust port 231*a* for exhausting an internal atmosphere of the process chamber 201 is installed below a sidewall of the reaction tube 203. As shown in FIG. 2, in the plane view, the exhaust port 231*a* is installed at a position opposing (facing) the nozzles 249*a* to 249*c* (the gas supply holes 250*a* to 250*c*) with the wafers 200 interposed therebetween. The exhaust port 231*a* may be installed from a lower portion of the sidewall of the reaction tube 203 to an upper portion thereof, that is, along the wafer arrangement region. An exhaust pipe 231 is connected to the exhaust port 231*a*. The exhaust pipe 231 is made of, for example, a metal material such as SUS or the like. A vacuum pump 246, which serves as a vacuum exhaust device, is connected to the exhaust pipe 231 via a pressure sensor 245, which serves as a pressure detector (pressure detection part) for detecting an internal pressure of the process chamber 201, and an auto pressure controller (APC) valve 244, which serves as a pressure regulator (pressure adjustment part). The APC valve 244 is configured to be capable of performing or stopping a vacuum exhausting operation in the process chamber 201 by opening/closing the valve in a state where the vacuum pump 246 is actuated, and is also configured to be capable of adjusting the internal pressure of the process chamber 201 by adjusting an opening degree of the valve based on pressure information detected by the pressure sensor 245 in the state where the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace opening cover configured to be capable of hermetically sealing a lower end opening of the manifold 209, is installed under the manifold 209. The seal cap 219 is made of, for example, a metal material such as SUS or the like, and is formed in a disc shape. An O-ring 220*b*, which is a seal member making contact with a lower end of the manifold 209, is installed on an upper surface of the seal cap 219. A rotation mechanism 267 configured to rotate a boat 217, which will be described later, is installed under the seal cap 219. A rotary shaft 255 of the rotation mechanism 267 is made of, for example, a metal material such as SUS or the like, and is connected to the boat 217 through the seal cap 219. The rotation mechanism 267 is configured to rotate the wafers 200 by rotating the boat 217. The seal cap 219 is configured to be vertically moved up and down by a boat elevator 115 which serves as an elevating mechanism installed outside the reaction tube 203. The boat elevator 115 is configured as a transfer device (transfer mechanism) which loads/unloads (transfers) the wafers 200 into/out of the process chamber 201 by moving the seal cap 219 up and down. A shutter 219*s*, which serves as a furnace opening cover configured to be capable of hermetically sealing the lower end opening of the manifold 209 in a state where the seal cap 219 is lowered and the boat 217 is unloaded from the process chamber 201, is installed under the manifold 209. The shutter 219*s* is made of, for example, a metal material such as SUS or the like, and is formed in a disc shape. An O-ring 220*c*, which is a seal member making contact with the lower end of the manifold 209, is installed on an upper surface of the shutter 219*s*. The opening/closing operation (such as elevation operation, rotation operation, or the like) of the shutter 219*s* is controlled by a shutter opening/closing mechanism 115*s*.

The boat 217 serving as a substrate support is configured to support the plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is made of, for example, a heat resistant material such as quartz, SiC, or the like. Heat insulating plates 218 made of, for example, a heat resistant material such as quartz, SiC, or the like are supported below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that an interior of the process chamber 201 has a desired temperature distribution. The temperature sensor 263 is installed along the inner wall of the reaction tube 203.

Figure 3:
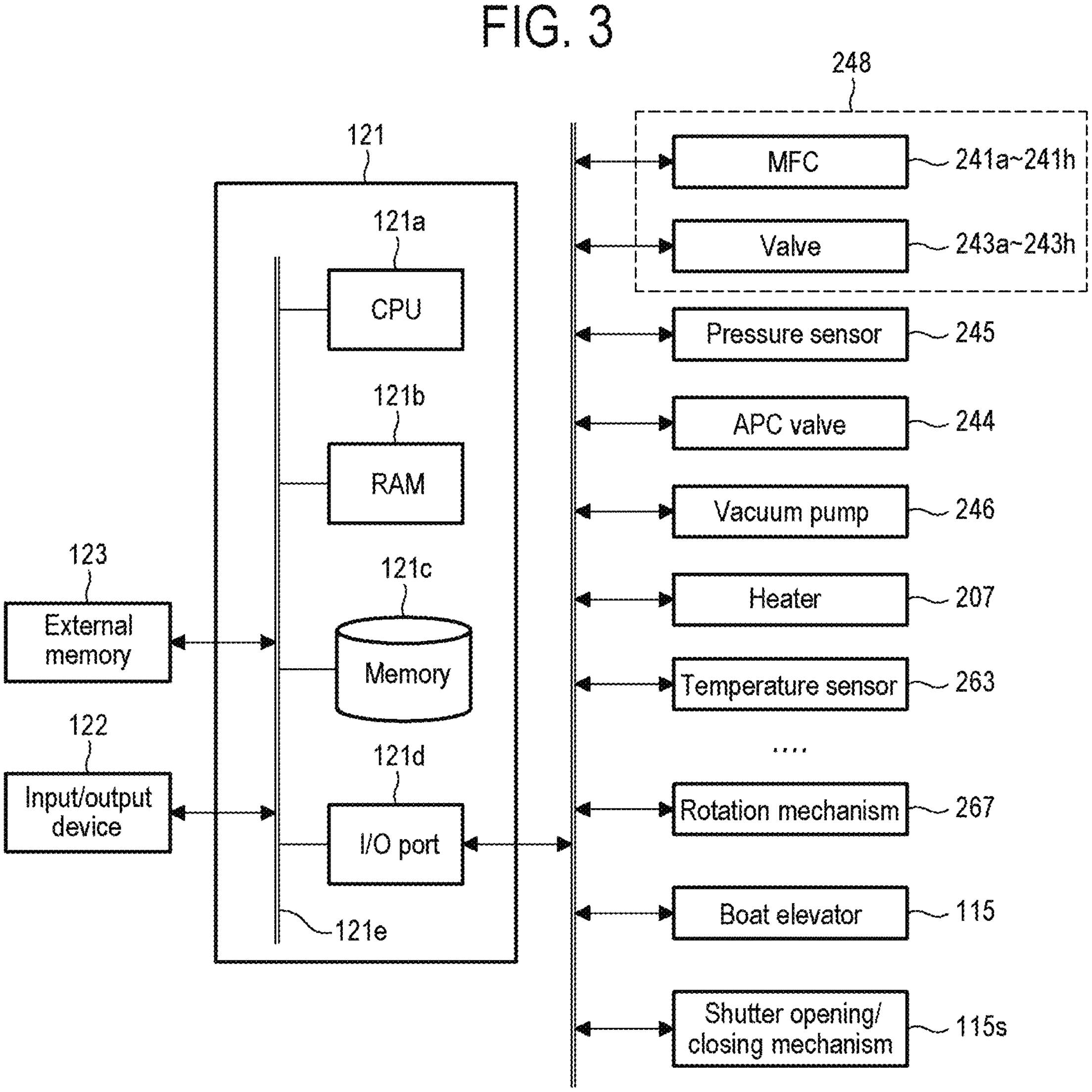
FIG. 3 is a schematic configuration diagram of a controller of the substrate processing apparatus suitably used in the embodiment of the present disclosure, in which a control system of the controller is shown in a block diagram.

As shown in FIG. 3, a controller 121, which is a control part (control means), is configured as a computer including a central processing unit (CPU) 121*a*, a random access memory (RAM) 121*b*, a memory 121*c*, and an I/O port 121*d*. The RAM 121*b*, the memory 121*c*, and the I/O port 121*d* are configured to be capable of exchanging data with the CPU 121*a* via an internal bus 121*e*. An input/output device 122 formed of, for example, a touch panel or the like, is connected to the controller 121. Further, an external memory 123 is configured to be capable of being connected to the controller 121.

The memory 121*c* is configured by, for example, a flash memory, a hard disk drive (HDD), a solid state drive (SSD), or the like. A control program for controlling operations of the substrate processing apparatus, a process recipe in which sequences and conditions of substrate processing to be described later are written, etc. are readably stored in the memory 121*c*. The process recipe functions as a program for causing, by the controller 121, the substrate processing apparatus to execute each sequence in the substrate processing, which will be described later, to obtain an expected result. Hereinafter, the process recipe and the control program may be generally and simply referred to as a "program." Further, the process recipe may be simply referred to as a "recipe." When the term "program" is used herein, it may indicate a case of including the recipe only, a case of including the control program only, or a case of including both the recipe and the control program. The RAM 121*b* is configured as a memory area (work area) in which programs or data read by the CPU 121*a* are temporarily stored.

The I/O port 121*d* is connected to the MFCs 241*a* to 241*h*, the valves 243*a* to 243*h*, the pressure sensor 245, the APC valve 244, the vacuum pump 246, the temperature sensor 263, the heater 207, the rotation mechanism 267, the boat elevator 115, the shutter opening/closing mechanism 115*s*, and so on.

The CPU 121*a* is configured to be capable of reading and executing the control program from the memory 121*c*. The CPU 121*a* is also configured to be capable of reading the recipe from the memory 121*c* according to an input and so on of an operation command from the input/output device 122. The CPU 121*a* is configured to be capable of controlling the flow rate adjusting operation of various kinds of gases by the MFCs 241*a* to 241*h*, the opening/closing operation of the valves 243*a* to 243*h*, an opening/closing operation of the APC valve 244, a pressure adjusting operation performed by the APC valve 244 based on the pressure sensor 245, an actuating and stopping operation of the vacuum pump 246, a temperature adjusting operation performed by the heater 207 based on the temperature sensor 263, an operation of rotating the boat 217 with the rotation mechanism 267 and adjusting the rotation speed of the boat 217, an operation of moving the boat 217 up and down by the boat elevator 115, the opening/closing operation of the shutter 219*s* by the shutter opening/closing mechanism 115*s*, and so on, according to contents of a read recipe.

The controller 121 may be configured by installing, on the computer, the aforementioned program stored in the external memory 123. Examples of the external memory 123 may include a magnetic disk such as a HDD or the like, an optical disc such as a CD or the like, a magneto-optical disc such as a MO or the like, a semiconductor memory such as a USB memory, a SSD, or the like. The memory 121*c* or the external memory 123 is configured as a non-transitory computer-readable recording medium. Hereinafter, the memory 121*c* and the external memory 123 may be generally and simply referred to as a "recording medium." When the term "recording medium" is used herein, it may indicate a case of including the memory 121*c* only, a case of including the external memory 123 only, or a case of including both the memory 121*c* and the external memory 123. Further, the program may be installed to the computer using communication means such as an internet, a dedicated line, or the like, instead of using the external memory 123.

(2) Substrate Processing Process

As a process of manufacturing a semiconductor device using the above-described substrate processing apparatus, an example of a method of processing a substrate, that is, a processing sequence for selectively forming a film on a surface of a first base among the first base and a second base exposed on the surface of the wafer 200 as the substrate, will be described mainly with reference to FIGS. 4A to 4E. In the following description, for the sake of convenience, as a representative example, a case where the first base is a silicon oxide film (SiO film) and the second base is a silicon nitride film (SiN film) will be described. In the following descriptions, the operations of the respective parts constituting the substrate processing apparatus are controlled by the controller 121.

As shown in FIGS. 4A to 4E, a processing sequence in the first embodiment includes:

step A of forming a first adsorption-inhibiting layer by adsorbing at least a portion of a molecular structure of molecules constituting a first precursor on the surface of the first base by supplying the first precursor to the wafer (200) including the first base and the second base exposed on the surface of the wafer;

step B of forming an adsorption-promoting layer on a surface of the second base by supplying a reactant to the wafer (200);

step C of forming a second adsorption-inhibiting layer by adsorbing at least a portion of a molecular structure of molecules constituting a second precursor on a surface of the adsorption-promoting layer by supplying the second precursor, which is different in molecular structure from the first precursor, to the wafer (200); and step D of forming the film on the surface of the first base by supplying a film-forming substance to the wafer (200) subjected to steps A, B, and C sequentially.

In step D in the first embodiment, the film is formed on the surface of the first base by invalidating an action of the first adsorption-inhibiting layer by an action of the film-forming substance. That is, in step D, an adsorption-inhibiting action of the first adsorption-inhibiting layer is cancelled by the action of the film-forming substance, thereby forming the film on the surface of the first base.

The term "substance" used in the present disclosure includes at least one selected from the group of a gaseous substance and a liquefied substance. The liquefied substance includes a misty substance. That is, each of the first precursor, the reactant, the second precursor, and the film-forming substance may include a gaseous substance, a liquefied substance such as a misty substance or the like, or both of them. The term "layer" used in the present disclosure includes at least one selected from the group of a continuous layer and a discontinuous layer. For example, each of the first adsorption-inhibiting layer and the second adsorption-inhibiting layer may include a continuous layer, a discontinuous layer, or both of them in a case that it is possible to cause the adsorption-inhibiting action. The adsorption-promoting layer may include a continuous layer, a discontinuous layer, or both of them in a case that it is possible to cause an adsorption promoting action.

Each of the first adsorption-inhibiting layer and the second adsorption-inhibiting layer has the adsorption-inhibiting action, and may be therefore called an inhibitor. The term "inhibitor" used herein may refer to, in addition to the first adsorption-inhibiting layer and the second adsorption-inhibiting layer, the first precursor and the second precursor, or residues derived from the first precursor and residues derived from the second precursor, and may also be used collectively for all of these.

In the present disclosure, for the sake of convenience, the above-described processing sequence may be denoted as follows. The same denotation may be used in other embodiments and modifications to be described later.

First adsorption-inhibiting layer formation→Adsorption-promoting layer formation→Second adsorption-inhibiting layer formation→Film formation When the term "wafer" is used herein, it may refer to "a wafer itself" or "a wafer and a stacked body of certain layers or films formed on a surface of a wafer." When the phrase "a surface of a wafer" is used herein, it may refer to "a surface of a wafer itself" or "a surface of a certain layer formed on a wafer." When the expression "a certain layer is formed on a wafer" is used herein, it may mean that "a certain layer is formed directly on a surface of a wafer itself" or that "a certain layer is formed on a layer formed on a wafer." When the term "substrate" is used herein, it may be synonymous with the term "wafer."

(Wafer Charging and Boat Loading)

After the boat 217 is charged with the plurality of wafers 200 (wafer charging), the shutter 219*s* is moved by the shutter opening/closing mechanism 115*s* and the lower end opening of the manifold 209 is opened (shutter open). Thereafter, as shown in FIG. 1, the boat 217 charged with the plurality of wafers 200 is lifted up by the boat elevator 115 to be loaded into the process chamber 201 (boat loading). In this state, the seal cap 219 seals the lower end of the manifold 209 through the O-ring 220*b*.

Figure 4A:
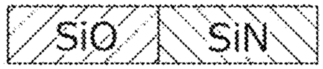
FIGS. 4A to 4E are schematic cross-sectional views showing a surface portion of a wafer in each step in selective growth according to a first embodiment of the present disclosure.

As shown in FIG. 4A, the SiO film as the first base and the SiN film as the second base are exposed on the surfaces of the wafers 200 filled in the boat 217. In the wafers 200, the surface of the SiO film, which is the first base, has OH terminations, which are adsorption sites, over an entire region (entire surface), while many regions of the surface of the SiN film, which is the second base, do not have the OH terminations.

(Pressure Adjustment and Temperature Adjustment)

After that, the interior of the process chamber 201, that is, a space where the wafers 200 are placed, is vacuum-exhausted (decompression-exhausted) by the vacuum pump 246 to have a desired pressure (degree of vacuum). At this time, the internal pressure of the process chamber 201 is measured by the pressure sensor 245, and the APC valve 244 is feedback-controlled based on the measured pressure information. Further, the wafers 200 in the process chamber 201 are heated by the heater 207 to have a desired temperature. At this time, the state of supplying electric power to the heater 207 is feedback-controlled based on the temperature information detected by the temperature sensor 263 that the interior of the process chamber 201 has the desired temperature distribution. Further, a rotation of the wafers 200 by the rotation mechanism 267 is started. An exhaust of the interior of the process chamber 201 and a heating and rotation of the wafers 200 are continuously performed at least until the processing on the wafers 200 is completed.

(Step A)

After that, the opening/closing operation of the valve in the first precursor supply system is controlled to supply the first precursor to the wafer 200 in the process chamber 201, that is, the wafer 200 including the first base and the second base exposed on the surface of the wafer 200. The first precursor supplied to the wafer 200 is exhausted through the exhaust port 231*a*. At this time, the inert gas may be supplied into the process chamber 201 from the inert gas supply system.

A processing condition for supplying the first precursor in step A may be a condition under which the first precursor is not thermally decomposed (vapor phase-decomposed), and is exemplified as follows.

- Processing temperature: 25 to 500 degrees C., specifically 50 to 300 degrees C.
- Processing pressure: 1 to 13,300 Pa, specifically 50 to 1,330 Pa
- First precursor supply flow rate: 1 to 3,000 sccm, specifically 50 to 1,000 sccm
- First precursor supply time: 0.1 seconds to 120 minutes, specifically 30 seconds to 60 minutes
- Inert gas supply flow rate (for each gas supply pipe): 0 to 20,000 sccm In the present disclosure, the notation of a numerical range such as “25 to 500 degrees C.” means that a lower limit value and an upper limit value are included in the range. Therefore, for example, “25 to 500 degrees C.” means “25 degrees C. or higher and 500 degrees C. or lower.” The same applies to other numerical ranges. The processing temperature means the temperature of the wafer 200, and the processing pressure means the internal pressure of the process chamber 201. Further, the gas supply flow rate of “0” means a case where no substance is supplied. These apply equally to the following description.

Figure 4B:
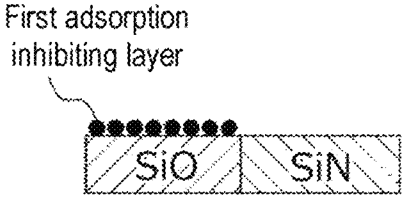

In step A, by supplying the first precursor to the wafer 200, it is possible to selectively (preferentially) adsorb at least the portion of the molecular structure of molecules constituting the first precursor on the surface of the SiO film that is the first base. As a result, as shown in FIG. 4B, the first adsorption-inhibiting layer is selectively (preferentially) formed on the surface of the SiO film. The first adsorption-inhibiting layer contains at least the portion of the molecular structure of the molecules constituting the first precursor, for example, residues derived from the first precursor. Examples of the residues derived from the first precursor contained in the first adsorption-inhibiting layer may include groups generated when the first precursor chemically reacts with adsorption sites (for example, the OH terminations on the surface of the SiO film) on the surface of the first base, and the like. In this way, the first adsorption-inhibiting layer exhibits the adsorption-inhibiting action (acts as the inhibitor) by including the residues derived from the first precursor.

Under the same conditions, the adsorption-inhibiting action by the first adsorption-inhibiting layer formed in step A may be weaker than the adsorption-inhibiting action by the second adsorption-inhibiting layer formed in step C which will be described later. Under the same conditions, the first adsorption-inhibiting layer formed in step A may desorb more easily than the second adsorption-inhibiting layer formed in step C which will be described later. Further, under the same conditions, a reactivity between the film-forming substance used in step D and the first adsorption-inhibiting layer formed in step A may be higher than a reactivity between the film-forming substance used in step D and the second adsorption-inhibiting layer formed in step C which will be described later. That is, the first adsorption-inhibiting layer formed in step A may have a more fragile molecular structure and be more susceptible to selective rupture than the second adsorption-inhibiting layer formed in step C. By doing so, in step D, it is possible to efficiently invalidate the action of the first adsorption-inhibiting layer. As a result, in step D, it is easier to selectively form the film on the surface of the first base.

After the first adsorption-inhibiting layer is formed on the surface of the SiO film that is the first base, the opening/closing operation of the valve in the first precursor supply system is controlled to stop a supply of the first precursor into the process chamber 201. Then, the interior of the process chamber 201 is vacuum-exhausted to remove the first precursor and the like remaining in the process chamber 201 from the process chamber 201. At this time, the inert gas may be supplied into the process chamber 201 from the inert gas supply system. The inert gas supplied from the inert gas supply system acts as the purge gas, thereby purging the interior of the process chamber 201 (purging).

A processing condition for purging in step A is exemplified as follows.

- Processing temperature: 25 to 500 degrees C., specifically 50 to 300 degrees C.
- Processing pressure: 1 to 1,330 Pa, specifically 1 to 400 Pa
- Inert gas supply flow rate (for each gas supply pipe): 0 to 10 slm, specifically 1 to 5 slm
- Inert gas supply time: 1 to 120 seconds Further, in step A, at least the portion of the molecular structure of the molecules constituting the first precursor may be adsorbed on a very small portion of the surface of the SiN film that is the second base. However, even in that case, an amount of the first adsorption-inhibiting layer formed on the surface of the SiN film is very small and an amount of the first adsorption-inhibiting layer formed on the surface of the SiO film is overwhelmingly large. Such a large difference in the amount of the first adsorption-inhibiting layer formed on the surface of the SiN film and the surface of the SiO film is because, as described above, the surface of the SiO film has the OH terminations over the entire region, whereas many regions on the surface of the SiN film do not have the OH terminations. This is also because the processing condition in step A is such that the first precursor is not thermally decomposed (vapor phase-decomposed) in the process chamber 201.

—First Precursor—

As the first precursor, a substance that is selectively (preferentially) adsorbed on the surface of the first base among the first base (for example, the SiO film) and the second base (for example, the SiN film) is used. As the first precursor, for example, a compound represented by Formula 1 below may be used.

$$[R^{11}]n^1\text{-}(X^1)\text{—}[R^{12}]m^{-1} \qquad \text{Formula 1}$$

In the above Formula 1, $R^{11}$ represents a first substituent directly bonded to $X^1$, $R^{12}$ represents a second substituent directly bonded to $X^1$, $X^1$ represents a tetravalent atom selected from the group of a carbon (C) atom, a silicon (Si) atom, a germanium (Ge) atom, and a tetravalent metal atom, $n^1$ represents an integer of 1 to 3, $m^1$ represents an integer of 1 to 3, and $n^1+m^1=4$.

In Formula 1, the number of $R^{11}$ as the first substituent, that is, $n^1$, is an integer of 1 to 3, more preferably 2 or 3. When $n^1$ is 2 or 3, the first substituents $R^{11}$ may be the same or different.

As the first substituent represented by $R^{11}$, a substituent having a function of causing the first adsorption-inhibiting layer to exhibit the adsorption-inhibiting action by being contained in the first adsorption-inhibiting layer can be used. That is, the first substituent represented by $R^{11}$ is contained in the residues derived from the first precursor contained in the first adsorption-inhibiting layer. The first substituent represented by $R^{11}$ may be a substituent that inhibits the second precursor from being adsorbed on the surface of the first base. Further, the first substituent represented by $R^{11}$ may be a chemically stable substituent.

The first substituent represented by $R^{11}$ may be a substituent having a weaker adsorption-inhibiting action than a first substituent of the second precursor used in step C. Further, the first substituent represented by $R^{11}$ may be a substituent that is more likely to lose the adsorption-inhibiting action than the first substituent of the second precursor used in step C. By doing so, under the same conditions, the adsorption-inhibiting action by the first adsorption-inhibiting layer formed in step A is made weaker than the adsorption-inhibiting action by the second adsorption-inhibiting layer formed in step C to be described later, which makes it easier to selectively form the film on the surface of the first base in step D.

Examples of the first substituent represented by $R^{11}$ may include a fluoro group, a fluoroalkyl group, a hydrogen group (—H), a hydrocarbon group, an alkoxy group, or the like. Among them, the first substituent represented by $R^{11}$ may be a hydrogen group or a hydrocarbon group, particularly preferably the hydrogen group. The hydrocarbon group may be an aliphatic hydrocarbon group such as an alkyl group, an alkenyl group, an alkynyl group, or the like, or may be an aromatic hydrocarbon group. Incidentally, when the term “substituent” is used herein, it may include the hydrogen group (—H) for the sake of convenience.

The alkyl group of a partial structure in the hydrocarbon group and the alkoxy group as the first substituent may be an alkyl group containing 1 to 4 carbon atoms. The alkyl group may be linear or branched. Examples of the alkyl group containing 1 to 4 carbon atoms may include a methyl group, an ethyl group, an n-propyl group, an n-butyl group, an isopropyl group, an isobutyl group, a sec-butyl group, a tert-butyl group, or the like. Examples of the alkoxy group as the first substituent may include a methoxy group, an ethoxy group, an n-propoxy group, an n-butoxy group, an isopropoxy group, an isobutoxy group, a sec-butoxy group, a tert-butoxy group, or the like.

In Formula 1, the number of $R^{12}$ as the second substituent, that is, $m^1$, is an integer of 1 to 3, more preferably 1 or 2. When $m^1$ is 2 or 3, the second substituent $R^{12}$ may be the same or different.

The second substituent represented by $R^{12}$ may be a substituent that allows chemisorption of the first precursor on the adsorption sites (for example, the OH terminations) on the surface of the first base.

Examples of the second substituent represented by $R^{12}$ may include an amino group, a chloro group, a bromo group, an iodo group, a hydroxy group, or the like. Among them, the second substituent represented by $R^{12}$ may be the amino group, more preferably a substituted amino group. In particular, from a viewpoint of adsorptivity of the first precursor on the first base, all the second substituents represented by $R^{12}$ may be substituted amino groups.

A substituent of the substituted amino group may be an alkyl group, more preferably an alkyl group containing 1 to 5 carbon atoms, and particularly preferably an alkyl group containing 1 to 4 carbon atoms. The alkyl group of the substituted amino group may be linear or branched. Examples of the alkyl group of the substituted amino group may include a methyl group, an ethyl group, an n-propyl group, an n-butyl group, an isopropyl group, an isobutyl group, a sec-butyl group, a tert-butyl group, or the like.

The number of substituents of the substituted amino group is one or two, preferably two. When the substituted amino group contains two substituents, the two substituents may be the same or different.

In Formula 1, an atom to which the first substituent and the second substituent are directly bonded, represented by $X^1$, is a tetravalent atom selected from the group of a C atom, a Si atom, a Ge atom, and a tetravalent metal atom. Examples of the tetravalent metal atom may include a titanium (Ti) atom, a zirconium (Zr) atom, a hafnium (Hf) atom, a molybdenum (Mo) atom, a tungsten (W) atom, or the like.

Among these, the C atom, the Si atom, and the Ge atom may be as the atom to which the first substituent and the second substituent are directly bonded, represented by $X^1$. This is because when $X^1$ is one of the C atom, the Si atom, and the Ge atom, at least one of high adsorptivity of the first precursor on the surface of the first base and high chemical stability of the first precursor after adsorption on the surface of the first base, that is, the residues derived from the first precursor, can be obtained. Among these, the Si atom may be as $X^1$. This is because when $X^1$ is the Si atom, both of high adsorptivity of the first precursor on the surface of the first base and high chemical stability of the first precursor after adsorption on the surface of the first base, that is, the residues derived from the first precursor, can be obtained in a well-balanced manner.

Although the compound represented by Formula 1 has been described above, the first precursor is not limited to the compound represented by Formula 1. For example, the first precursor may include a molecule containing the above-described first substituent, the above-described second substituent, and the atom to which the first substituent and the second substituent are directly bonded, but the atom to which the first substituent and the second substituent are directly bonded may be a metal atom capable of bonding to five or more ligands. When the atom to which the first substituent and the second substituent are directly bonded is the metal atom capable of bonding to five or more ligands, since the number of the first substituent and the second substituent in the molecule of the first precursor can be increased over the compound represented by Formula 1, the adsorption-inhibiting action of the first adsorption-inhibiting layer can be adjusted. Further, the first precursor may include a molecule containing the above-described first substituent, the above-described second substituent, and two or more atoms to which the first substituent and the second substituent are directly bonded.

Examples of the first precursor may include (dimethylamino)dimethylsilane: $(CH_3)_2NSiH(CH_3)_2$, (ethylamino)dimethylsilane: $(C_2H_5)HNSiH(CH_3)_2$, (propylamino)dimethylsilane: $(C_3H_7)_2HNSiH(CH_3)_2$, (butylamino) dimethylsilane: $(C_4H_9)_2HNSiH(CH_3)_2$, (diethylamino) dimethylsilane: $(C_2H_5)_2NSiH(CH_3)_2$, (dipropylamino) dimethylsilane: $(C_3H_7)_2NSiH(CH_3)_2$, (dibutylamino) dimethylsilane: $(C_3H_7)_2NSiH(CH_3)_2$, (dimethylamino) methylsilane: $(CH_3)_2NSiH_2(CH_3)$, (ethylamino) methylsilane: $(C_2H_5)HNSiH_2(CH_3)$, (propylamino) methylsilane: $(C_3H_7)_2HNSiH_2(CH_3)$, (butylamino) methylsilane: $(C_4H_9)_2HNSiH_2(CH_3)$, (diethylamino) methylsilane: $(C_2H_5)_2NSiH_2(CH_3)$, (dipropylamino) methylsilane: $(C_3H_7)_2NSiH_2(CH_3)$, (dibutylamino) methylsilane: $(C_3H_7)_2NSiH_2(CH_3)$, (dimethylamino) diethylsilane: $(CH_3)_2NSiH(C_2H_5)_2$, (ethylamino) diethylsilane: $(C_2H_5)HNSiH(C_2H_5)_2$, (propylamino) diethylsilane: $(C_3H_7)_2HNSiH(C_2H_5)_2$, (butylamino) diethylsilane: $(C_4H_9)_2HNSiH(C_2H_5)_2$, (diethylamino) diethylsilane: $(C_2H_5)_2NSiH(C_2H_5)_2$, (dipropylamino) diethylsilane: $(C_3H_7)_2NSiH(C_2H_5)_2$, (dibutylamino) diethylsilane: $(C_3H_7)_2NSiH(C_2H_5)_2$, (dimethylamino) ethylsilane: $(CH_3)_2NSiH_2(C_2H_5)$, (ethylamino)ethylsilane: $(C_2H_5)HNSiH_2(C_2H_5)$, (propylamino)ethylsilane: $(C_3H_7)_2HNSiH_2(C_2H_5)$, (butylamino)ethylsilane: $(C_4H_9)_2HNSiH_2(C_2H_5)$, (diethylamino)ethylsilane: $(C_2H_5)_2NSiH_2(C_2H_5)$, (dipropylamino)ethylsilane: $(C_3H_7)_2NSiH_2(C_2H_5)$, (dibutylamino)ethylsilane: $(C_3H_7)_2NSiH_2(C_2H_5)$, (dipropylamino) silane: $[(C_3H_7)_2N]SiH_3$, (dibutylamino)silane: $[(C_4H_9)_2N]SiH_3$, (dipentylamino)silane: $[(C_5H_{11})_2N]SiH_3$, bis (dimethylamino)dimethylsilane: $[(CH_3)_2N]_2Si(CH_3)_2$, bis (ethylamino)dimethylsilane: $[(C_2H_5)HN]_2Si(CH_3)_2$, bis (propylamino)dimethylsilane: $[(C_3H_7)_2HN]_2Si(CH_3)_2$, bis (butylamino)dimethylsilane: $[(C_4H_9)_2HN]_2Si(CH_3)_2$, bis (diethylamino)dimethylsilane: $[(C_2H_5)_2N]_2Si(CH_3)_2$, bis (dipropylamino)dimethylsilane: $[(C_3H_7)_2N]_2Si(CH_3)_2$, bis (dibutylamino)dimethylsilane: $[(C_3H_7)_2N]_2Si(CH_3)_2$, bis (dimethylamino)methylsilane: $[(CH_3)_2N]_2SiH(CH_3)$, bis (ethylamino)methylsilane: $[(C_2H_5)HN]_2SiH(CH_3)$, bis (propylamino)methylsilane: $[(C_3H_7)_2HN]_2SiH(CH_3)$, bis (butylamino)methylsilane: $[(C_4H_9)_2HN]_2SiH(CH_3)$, bis (diethylamino)methylsilane: $[(C_2H_5)_2N]_2SiH(CH_3)$, bis (dipropylamino)methylsilane: $[(C_3H_7)_2N]_2SiH(CH_3)$, bis (dibutylamino)methylsilane: $[(C_3H_7)_2N]_2SiH(CH_3)$, bis (dimethylamino)diethylsilane: $[(CH_3)_2N]_2Si(C_2H_5)_2$, bis (ethylamino)diethylsilane: $[(C_2H_5)HN]_2Si(C_2H_5)_2$, bis (propylamino)diethylsilane: $[(C_3H_7)_2HN]_2Si(C_2H_5)_2$, bis (butylamino)diethylsilane: $[(C_4H_9)_2HN]_2Si(C_2H_5)_2$, bis (diethylamino)diethylsilane: $[(C_2H_5)_2N]_2Si(C_2H_5)_2$, bis (dipropylamino)diethylsilane: $[(C_3H_7)_2N]_2Si(C_2H_5)_2$, bis (dibutylamino)diethylsilane: $[(C_3H_7)_2N]_2Si(C_2H_5)_2$, bis (dimethylamino)ethylsilane: $[(CH_3)_2N]_2SiH(C_2H_5)$, bis (ethylamino)ethylsilane: $[(C_2H_5)H\ N]_2SiH(C_2H_5)$, bis (propylamino)ethylsilane: $[(C_3H_7)_2HN]_2SiH(C_2H_5)$, bis (butylamino)ethylsilane: $[(C_4H_9)_2HN]_2SiH(C_2H_5)$, bis (diethylamino)ethylsilane: $[(C_2H_5)_2N]_2SiH(C_2H_5)$, bis (dipropylamino)ethylsilane: $[(C_3H_7)_2N]_2SiH(C_2H_5)$, bis (dibutylamino)ethylsilane: $[(C_3H_7)_2N]_2SiH(C_2H_5)$, bis (diethylamino)silane: $[(C_2H_5)_2N]_2SiH_2$, bis(dipropylamino) silane: $[(C_3H_7)_2N]_2SiH_2$, bis(dibutylamino)silane: $[(C_4H_9)_2N]_2SiH_2$, bis(dipentylamino)silane: $[(C_5H_{11})_2N]_2SiH_2$, (dimethylamino)trimethoxysilane: $(CH_3)_2NSi(OCH_3)_3$, (dimethylamino)triethoxysilane: $(CH_3)_2NSi(OC_2H_5)_3$, (dimethylamino)triprotoxysilane: $(CH_3)_2NSi(OC_3H_7)_3$, (dimethylamino)tributhoxysilane: $(CH_3)_2NSi(OC_4H_9)_3$, or the like.

One or more of these can be used as the first precursor. Further, under the same conditions, it may be performed to select the first precursor used in step A so that the adsorption-inhibiting action by the first adsorption-inhibiting layer formed in step A is weaker than the adsorption-inhibiting action by the second adsorption-inhibiting layer formed in step C to be described later. Since the adsorption-inhibiting action by the first adsorption-inhibiting layer can be adjusted by the number and type of first substituents contained in the first precursor, the first precursor used in step A can be appropriately selected according to the number and type of first substituents contained in the second precursor used in step C. Specifically, if the first precursor and the second precursor have the same number of first substituents and the second precursor contains only the alkyl group as the first substituent, it may be performed to select the first precursor containing only the hydrogen group as the first substituent, containing only the alkoxy group as the first substituent, or containing fewer alkyl groups and hydrogen groups or alkoxy groups than the first substituent in the second precursor. This is because in comparison among the alkyl group, the hydrogen group, and the alkoxy group, the alkyl group has the strongest adsorption-inhibiting action, the hydrogen group has the second strongest adsorption-inhibiting action, and the alkoxy group has the weakest adsorption-inhibiting action. Further, if both the first precursor and the second precursor contain the same first substituent (for example, an alkyl group), it may be performed to select the first precursor having the number of first substituents smaller than the number of first substituents in the second precursor. This is because the smaller the number of first substituents, the weaker the adsorption-inhibiting action of the formed adsorption-inhibiting layer.

Further, it may be performed to use the first precursor having the number of second substituents contained in one molecule, which is equal to or larger than the number of second substituents contained in the second precursor used in step C. This is because the more the second substituents contained in one molecule, the fewer the first substituents contained in one molecule, and thus the weaker the adsorption-inhibiting action of the adsorption-inhibiting layer. By doing so, under the same conditions, the adsorption-inhibiting action by the first adsorption-inhibiting layer formed in step A is made weaker than the adsorption-inhibiting action by the second adsorption-inhibiting layer formed in step C to be described later that makes it easier to selectively form the film on the surface of the first base in step D.

In step A, if the first precursor containing the fluoro group, the fluoroalkyl group, the hydrogen group, or the like as the first substituent cannot stably exist as a single compound, a first precursor that contains other first substituent and can stably exist as a single compound may be adsorbed on the first base and then subjected to specific treatment to convert the other first substituent into the hydrogen group, the fluoro group, or the fluoroalkyl group. Examples of methods for converting the first substituent are shown below.

As a first example, after the first precursor containing the hydrogen group as the first substituent is adsorbed on the first base, by exposing the wafer 200 to a fluorine (F)-containing gas such as a fluorine ($F_2$) gas, a chlorine trifluoride ($ClF_3$) gas, a chlorine fluoride (ClF) gas, a hydrogen fluoride (HF) gas or the like, the hydrogen group can be converted into the fluoro group. As a second example, after the first precursor containing the alkyl group as the first substituent is adsorbed on the first base, by exposing the wafer 200 to the above-mentioned F-containing gas, the alkyl group can be converted into the fluoroalkyl group. As a third example, after the first precursor containing the chloro group as the first substituent is adsorbed on the first base, by exposing the wafer 200 to an atmosphere obtained by exciting a hydrogen (H)-containing gas such as a hydrogen ($H_2$) gas with plasma, for example, to hydrogen plasma, the chloro group can be converted into the hydrogen group.

—Inert Gas—

Examples of the inert gas may include a nitrogen ($N_2$) gas and rare gases such as an argon (Ar) gas, a helium (He) gas, a neon (Ne) gas, a xenon (Xe) gas, or the like. One or more of these gases can be used as the inert gas. This point also applies to each step using the inert gas, which will be described later. The inert gas acts as the purge gas, the carrier gas, the dilution gas, or the like.

(Step B)

After step A is completed, the opening/closing operation of the valve in the reactant supply system is controlled to supply the reactant to the wafer 200 in the process chamber 201. The reactant supplied to the wafer 200 is exhausted through the exhaust port 231*a*. At this time, the inert gas may be supplied into the process chamber 201 from the inert gas supply system.

Figure 4C:
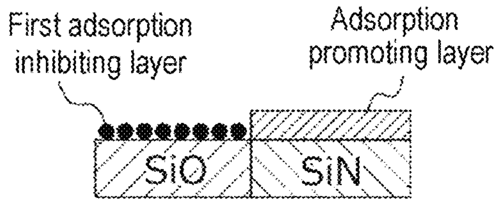

In step B, by supplying the reactant to the wafer 200, as shown in FIG. 4C, the adsorption-promoting layer is selectively (preferentially) formed on the surface of the SiN film that is the second base. At this time, adsorption of the reactant on the surface of the first base is inhibited by the adsorption-inhibiting action of the first adsorption-inhibiting layer formed on the surface of the SiO film that is the first base, thereby inhibiting the adsorption-promoting layer from being formed on the surface of the first base.

The adsorption-promoting layer formed in step B may be capable of adsorbing the second precursor supplied to the wafer 200 in step C. A form of the adsorption-promoting layer formed in step B is not particularly limited in a case that the second precursor can be adsorbed on the second base through the adsorption-promoting layer, and may be, for example, a monomolecular form, a chain polymer form, a film, or the like.

The higher a density of the second precursor adsorbed on the surface of the second base, the stronger an effect of inhibiting the film-forming substance from being adsorbed on the second base. Therefore, the adsorption-promoting layer may be capable of adsorbing the second precursor at a high density, and the form of the adsorption-promoting layer may be the film. This is because when the adsorption-promoting layer takes the form of the film, it is possible to allow the adsorption sites of the second precursor to exist at the high density (a large amount) on the surface of the adsorption-promoting layer. In other words, the adsorption-promoting layer may be the film having the high density (large amount) of adsorption sites of the second precursor on the surface of the film.

Further, in step B, it may be performed to form an oxygen (O)-containing layer as the adsorption-promoting layer. This is because by making the adsorption-promoting layer an O-containing layer, the surface of the adsorption-promoting layer can have the OH terminations as adsorption sites, which makes it easy to adsorb the second precursor on the adsorption-promoting layer. That is, by forming the O-containing layer as the adsorption-promoting layer in step B, it is possible to efficiently form the second adsorption-inhibiting layer on the surface of the adsorption-promoting layer with high selectivity in step C. In particular, from a viewpoint of having the high density (large amount) of OH terminations on the surface of the adsorption-promoting layer, a layer containing at least Si and O, such as a silicon oxide layer (SiO layer), a silicon oxycarbide layer (SiOC layer), or the like, may be used as the adsorption-promoting layer.

The adsorption-promoting layer may be formed by supplying the reactant to the wafer 200, and a method of forming the adsorption-promoting layer is not particularly limited. For example, when forming the O-containing layer as the adsorption-promoting layer in step B, a method of forming the film using the film-forming substance as the reactant to deposit the O-containing layer on the surface of the second base can be used. As this method, for example, a film-forming method (and film-forming conditions) similar to a film-forming method (and film forming conditions) using the film-forming substance in step D to be described later can be used. When the adsorption-promoting layer is formed by depositing the O-containing layer on the surface of the second base, the adsorption-promoting layer having the OH terminations as the adsorption sites on the surface of the adsorption-promoting layer is obtained, which makes it possible to efficiently form the second adsorption-inhibiting layer on the surface of the adsorption-promoting layer with high selectivity in step C.

Further, when forming the O-containing layer as the adsorption-promoting layer in step B, a method of using an oxidizing agent as the reactant to oxidize the surface of the second base may be used. Even when forming the adsorption-promoting layer by oxidizing the surface of the second base, the adsorption-promoting layer having the OH terminations as the adsorption sites on the surface of the adsorption-promoting layer is obtained, which makes it possible to efficiently form the second adsorption-inhibiting layer on the surface of the adsorption-promoting layer with high selectivity in step C. An example of the oxidizing agent used in this method may include an O-containing substance.

A processing condition for supplying the O-containing substance that is the oxidizing agent as the reactant in step B is exemplified as follows.

Processing temperature: room temperature to 600 degrees C., specifically 50 to 400 degrees C.

Processing pressure: 1 to 101,325 Pa, specifically 1 to 1,300 Pa

O-containing substance supply flow rate: 1 to 20,000 sccm, specifically 1 to 10,000 sccm O-containing substance supply time: 1 second to 240 minutes, specifically 30 seconds to 120 minutes Other conditions can be the same as the processing condition in step A.

In step B, it is desirable that a thickness of the adsorption-promoting layer formed on the surface of the second base is 0.5 nm or more and 10 nm or less, preferably 1 nm or more and 5 nm or less, more preferably 1.5 nm or more and 3 nm or less.

If the thickness of the adsorption-promoting layer is less than 0.5 nm, in step C, at least the portion of the molecular structure of molecules constituting the second precursor adsorbed on the surface of the adsorption-promoting layer (residues derived from the second precursor) may be insufficient. In this case, an adsorption-inhibiting effect by the second adsorption-inhibiting layer formed on the surface of the adsorption-promoting layer may be insufficient. This problem can be solved by setting the thickness of the adsorption-promoting layer to 0.5 nm or more. By setting the thickness of the adsorption-promoting layer to 1 nm or more, this problem can be sufficiently solved, and by setting the thickness of the adsorption-promoting layer to 1.5 nm or more, this problem can be more sufficiently solved.

If the thickness of the adsorption-promoting layer is more than 10 nm, in step B, the adsorption-inhibiting action of at least the portion of the first adsorption-inhibiting layer formed on the surface of the first base may be invalidated by an action of the reactant, so that an adsorption-inhibiting effect by the first adsorption-inhibiting layer is insufficient. As a result, the adsorption-promoting layer is also formed on the surface of the first base, and in the subsequent step C, the second adsorption-inhibiting layer is also formed on the surface of the first base. This problem can be solved by setting the thickness of the adsorption-promoting layer to 10 nm or less. By setting the thickness of the adsorption-promoting layer to 5 nm or less, this problem can be sufficiently solved, and by setting the thickness of the adsorption-promoting layer to 3 nm or less, this problem can be more sufficiently solved.

By setting the thickness of the adsorption-promoting layer within a range described the above, in step C, it is possible to efficiently form the second adsorption-inhibiting layer on the surface of the adsorption-promoting layer with high selectivity.

After the adsorption-promoting layer is formed on the surface of the SiN film that is the second base, the opening/closing operation of the valve in the reactant supply system is controlled to stop a supply of the reactant into the process chamber 201. Then, the reactant and the like remaining in the process chamber 201 are removed from the process chamber 201 (purging) according to the same processing procedure and processing condition as the purging in the above-described step A.

—O-containing Substance—

Examples of the O-containing substance may include an O-containing gas, an O- and H-containing gas, an O- and N-containing gas, an O- and C-containing gas, or the like. The O-containing substance may be used after being thermally excited in a non-plasma atmosphere, or may be used after being plasma-excited.

Examples of the O-containing gas may include an oxygen ($O_2$) gas, an ozone ($O_3$) gas, or the like. Examples of the O- and H-containing gas may include water vapor ($H_2O$ gas), a hydrogen peroxide ($H_2O_2$) gas, an $O_2$ gas+$H_2$ gas, an $O_3$ gas+$H_2$ gas, or the like. Examples of the O- and N-containing gas may include a nitric oxide (NO) gas, a nitrous oxide ($N_2O$) gas, a nitrogen dioxide ($NO_2$) gas, an $O_2$ gas+$NH_3$ gas, an $O_3$ gas+$NH_3$ gas, or the like. Examples of the O- and C-containing gas may include a carbon dioxide ($CO_2$) gas, a carbon monoxide (CO) gas, or the like. One or more of these gases can be used as the O-containing substance.

In the present disclosure, the description of two gases such as "$O_2$ gas+$H_2$ gas" together means a mixed gas of $O_2$ gas and $H_2$ gas. When supplying the mixed gas, the two gases may be mixed (pre-mixed) in a supply pipe and then supplied into the process chamber 201, or the two gases may be supplied separately from different supply pipes into the process chamber 201 and then mixed (post-mixed) in the process chamber 201.

(Step C)

After step B is completed, the opening/closing operation of the valve in the second precursor supply system is controlled to supply the second precursor having the molecular structure different from that of the first precursor to the wafer 200 in the process chamber 201. The second precursor supplied to the wafer 200 is exhausted through the exhaust port 231*a*. At this time, the inert gas may be supplied into the process chamber 201 from the inert gas supply system.

A processing condition for supplying the second precursor in step C may be a condition under which the second precursor is not thermally decomposed (vapor phase-decomposed), and is exemplified as follows.

Processing temperature: 25 to 500 degrees C., specifically 50 to 300 degrees C.

Processing pressure: 1 to 13,300 Pa, specifically 50 to 1,330 Pa

Second precursor supply flow rate: 1 to 3,000 sccm, specifically 50 to 1,000 sccm Second precursor supply time: 0.1 seconds to 120 minutes, specifically 30 seconds to 60 minutes Other conditions can be the same as the processing condition in step A.

Figure 4D:
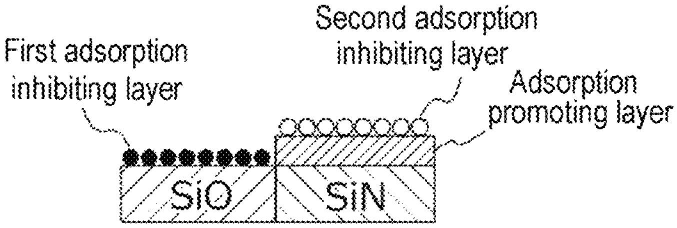

In step C, by supplying the second precursor to the wafer 200, at least the portion of the molecular structure of molecules constituting the second precursor can be selectively (preferentially) adsorbed on the surface of the adsorption-promoting layer formed on the surface of the SiN film that is the second base. As a result, as shown in FIG. 4D, the second adsorption-inhibiting layer is selectively (preferentially) formed on the surface of the adsorption-promoting layer. At this time, the second adsorption-inhibiting layer can be inhibited from being formed on the surface of the SiO film by the action of the first adsorption-inhibiting layer formed on the surface of the SiO film that is the first base. The second adsorption-inhibiting layer contains at least the portion of the molecular structure of the molecules constituting the second precursor, for example, the residues derived from the second precursor. Examples of the residues derived from the second precursor contained in the second adsorption-inhibiting layer may include groups generated when the second precursor chemically reacts with the adsorption sites (for example, OH terminations) on the surface of the adsorption-promoting layer, and the like. In this way, the second adsorption-inhibiting layer exhibits the adsorption-inhibiting action (acts as the inhibitor) by including the residues derived from the second precursor.

After the second adsorption-inhibiting layer is formed on the surface of the adsorption-promoting layer formed on the surface of the SiN film that is the second base, the opening/closing operation of the valve in the second precursor supply system is controlled to stop a supply of the second precursor into the process chamber 201. Then, the second precursor and the like remaining in the process chamber 201 are removed from the process chamber 201 (purging) according to the same processing procedure and processing condition as the purging in the above-described step A.

—Second Precursor—

As the second precursor, a substance that is selectively (preferentially) adsorbed on the surface of the adsorption-promoting layer is used. As the second precursor, for example, a compound represented by Formula 2 below may be used.

$$[R^{21}]n^2\text{-}(X^2)\text{—}[R^{22}]m^2; \quad \text{Formula 2}$$

In the above Formula 2, $R^{21}$ represents a first substituent directly bonded to $X^2$, $R^{22}$ represents a second substituent directly bonded to $X^2$, $X^2$ represents a tetravalent atom selected from the group of a C atom, a Si atom, a Ge atom, and a tetravalent metal atom, $n^2$ represents an integer of 1 to 3, $m^2$ represents an integer of 1 to 3, and $n^2+m^2=4$.

In Formula 2, the number of $R^{21}$ as the first substituent, that is, $n^2$, is an integer of 1 to 3, preferably 2 or 3. When $n^2$ is 2 or 3, the first substituents $R^{21}$ may be the same or different.

As the first substituent represented by $R^{21}$, a substituent having a function of causing the second adsorption-inhibiting layer to exhibit the adsorption-inhibiting action by being contained in the second adsorption-inhibiting layer can be used. That is, the first substituent represented by $R^{21}$ is contained in the residues derived from the second precursor contained in the second adsorption-inhibiting layer. The first substituent represented by $R^{21}$ may be a substituent that inhibits the film-forming substance from being adsorbed on the surface of the second base. Further, the first substituent represented by $R^{21}$ may be a chemically stable substituent.

The first substituent represented by $R^{21}$ may be a substituent having a stronger adsorption-inhibiting action than the first substituent of the first precursor used in step A. Further, the first substituent represented by $R^{21}$ may be a substituent that is more unlikely to lose the adsorption-inhibiting action than the first substituent of the first precursor used in step A. By doing so, under the same conditions, the adsorption-inhibiting action by the second adsorption-inhibiting layer formed in step C is made stronger than the adsorption-inhibiting action by the first adsorption-inhibiting layer formed in step A, which makes it easier to selectively form the film on the surface of the first base in step D.

The first substituent represented by $R^{21}$ has the same meaning as $R^{11}$ in Formula 1 except for the matters shown below, and are also the same for preferred embodiments. The first substituent represented by $R^{21}$ may be a hydrogen group or a hydrocarbon group, more preferably the hydrocarbon group, and furthermore preferably an alkyl group.

In Formula 2, the number of $R^{22}$ as the second substituent, that is, $m^2$, is an integer of 1 to 3, more preferably 1 or 2. When $m^2$ is 2 or 3, the second substituent $R^{22}$ may be the same or different.

The second substituent represented by $R^{22}$ may be a substituent that allows chemisorption of the second precursor on the adsorption sites (for example, the OH terminations) on the surface of the adsorption-promoting layer.

The second substituent represented by $R^{22}$ has the same meaning as $R^{12}$ in Formula 1, and are also the same for preferred embodiments.

In Formula 2, an atom to which the first substituent and the second substituent are directly bonded, represented by $X^2$, has the same meaning as $X^1$ in Formula 1, and are also the same for preferred embodiments. A Si atom may be as $X^2$. This is because when $X^2$ is the Si atom, both of high adsorptivity of the second precursor on the surface of the adsorption-promoting layer and high chemical stability of the second precursor after adsorption on the surface of the adsorption-promoting layer, that is, the residues derived from the second precursor, can be obtained in a well-balanced manner.

Although the compound represented by Formula 2 has been described above, the second precursor is not limited to the compound represented by Formula 2. For example, the second precursor may include a molecule containing the above-described first substituent, the above-described second substituent, and the atom to which the first substituent and the second substituent are directly bonded, but the atom to which the first substituent and the second substituent are directly bonded may be a metal atom capable of bonding to five or more ligands. When the atom to which the first substituent and the second substituent are directly bonded is the metal atom capable of bonding to five or more ligands, since the number of the first substituent and the second substituent in the molecule of the second precursor can be increased over the compound represented by Formula 2, the adsorption-inhibiting action of the second adsorption-inhibiting layer can be adjusted. Further, the second precursor may include a molecule containing the above-described first substituent, the above-described second substituent, and two or more atoms to which the first substituent and the second substituent are directly bonded.

Examples of the second precursor may include (dimethylamino)methylsilane: $(CH_3)_2NSiH_2(CH_3)$, (ethylamino)methylsilane: $(C_2H_5)HNSiH_2(CH_3)$, (propylamino)methylsilane: $(C_3H_7)_2HNSiH_2(CH_3)$, (butylamino)methylsilane: $(C_4H_9)_2HNSiH_2(CH_3)$, (diethylamino)methylsilane: $(C_2H_5)_2$ $NSiH_2(CH_3)$, (dipropylamino)methylsilane: $(C_3H_7)_2$ $NSiH_2(CH_3)$, (dibutylamino)methylsilane: $(C_3H_7)_2$ $NSiH_2(CH_3)$, (dimethylamino)dimethylsilane: $(CH_3)_2NSiH(CH_3)_2$, (ethylamino)dimethylsilane: $(C_2H_5)HNSiH(CH_3)_2$, (propylamino)dimethylsilane: $(C_3H_7)_2HNSiH(CH_3)_2$, (butylamino)dimethylsilane: $(C_4H_9)_2HNSiH(CH_3)_2$, (diethylamino)dimethylsilane: $(C_2H_5)_2NSiH(CH_3)_2$, (dipropylamino)dimethylsilane: $(C_3H_7)_2NSiH(CH_3)_2$, (dibutylamino)dimethylsilane: $(C_3H_7)_2NSiH(CH_3)_2$, (dimethylamino)trimethylsilane: $(CH_3)_2NSi(CH_3)_3$, (ethylamino)trimethylsilane: $(C_2H_5)HNSi(CH_3)_3$, (propylamino)trimethylsilane: $(C_3H_7)_2HNSi(CH_3)_3$, (butylamino)trimethylsilane: $(C_4H_9)_2HNSi(CH_3)_3$, (diethylamino)trimethylsilane: $(C_2H_5)_2NSi(CH_3)_3$, (dipropylamino)trimethylsilane: $(C_3H_7)_2NSi(CH_3)_3$, (dibutylamino)trimethylsilane: $(C_3H_7)_2NSi(CH_3)_3$, (dimethylamino)ethylsilane: $(CH_3)_2NSiH_2(C_2H_5)$, (ethylamino)ethylsilane: $(C_2H_5)HNSiH_2(C_2H_5)$, (propylamino)ethylsilane: $(C_3H_7)_2$ $HNSiH_2(C_2H_5)$, (butylamino)ethylsilane: $(C_4H_9)_2HNSiH_2$ $(C_2H_5)$, (diethylamino)ethylsilane: $(C_2H_5)_2NSiH_2(C_2H_5)$, (dipropylamino)ethylsilane: $(C_3H_7)_2NSiH_2(C_2H_5)$, (dibutylamino)ethylsilane: $(C_3H_7)_2NSiH_2(C_2H_5)$, (dimethylamino)diethylsilane: $(CH_3)_2NSiH(C_2H_5)_2$, (ethylamino)diethylsilane: $(C_2H_5)HNSiH(C_2H_5)_2$, (propylamino)diethylsilane: $(C_3H_7)_2HNSiH(C_2H_5)_2$, (butylamino)diethylsilane: $(C_4H_9)_2$ $HNSiH(C_2H_5)_2$, (diethylamino)diethylsilane: $(C_2H_5)_2NSiH$ $(C_2H_5)_2$, (dipropylamino)diethylsilane: $(C_3H_7)_2NSiH$ $(C_2H_5)_2$, (dibutylamino)diethylsilane: $(C_3H_7)_2NSiH$ $(C_2H_5)_2$, (dimethylamino)triethylsilane: $(CH_3)_2NSi(C_2H_5)_3$, (ethylamino)triethylsilane: $(C_2H_5)HNSi(C_2H_5)_3$, (propylamino)triethylsilane: $(C_3H_7)_2HNSi(C_2H_5)_3$, (butylamino)triethylsilane: $(C_4H_9)_2HNSi(C_2H_5)_3$, (diethylamino)triethylsilane: $(C_2H_5)_2NSi(C_2H_5)_3$, (dipropylamino)triethylsilane: $(C_3H_7)_2NSi(C_2H_5)_3$, (dibutylamino)triethylsilane: $(C_3H_7)_2$ $NSi(C_2H_5)_3$, (dipropylamino)silane: $[(C_3H_7)_2N]SiH_3$, (dibutylamino)silane: $[(C_4H_9)_2N]SiH_3$, (dipentylamino)silane: $[(C_5H_{11})_2N]SiH_3$, bis(dimethylamino)dimethylsilane: $[(CH_3)_2N]_2Si(CH_3)_2$, bis(ethylamino)dimethylsilane: $[(C_2H_5)HN]_2Si(CH_3)_2$, bis(propylamino)dimethylsilane: $[(C_3H_7)_2HN]_2Si(CH_3)_2$, bis(butylamino)dimethylsilane: $[(C_4H_9)_2HN]_2Si(CH_3)_2$, bis(diethylamino)dimethylsilane: $[(C_2H_5)_2N]_2Si(CH_3)_2$, bis(dipropylamino)dimethylsilane: $[(C_3H_7)_2N]_2Si(CH_3)_2$, bis(dibutylamino)dimethylsilane: $[(C_3H_7)_2N]_2Si(CH_3)_2$, bis(dimethylamino)methylsilane: $[(CH_3)_2N]_2SiH(CH_3)$, bis(ethylamino)methylsilane: $[(C_2H_5)HN]_2SiH(CH_3)$, bis(propylamino)methylsilane: $[(C_3H_7)_2HN]_2SiH(CH_3)$, bis(butylamino)methylsilane: $[(C_4H_9)_2HN]_2SiH(CH_3)$, bis(diethylamino)methylsilane: $[(C_2H_5)_2N]_2SiH(CH_3)$, bis(dipropylamino)methylsilane: $[(C_3H_7)_2N]_2SiH(CH_3)$, bis(dibutylamino)methylsilane: $[(C_3H_7)_2N]_2SiH(CH_3)$, bis(dimethylamino)diethylsilane: $[(CH_3)_2N]_2Si(C_2H_5)_2$, bis(ethylamino)diethylsilane:

$[(C_2H_5)HN]_2Si(C_2H_5)_2$, bis(propylamino)diethylsilane: $[(C_3H_7)_2HN]_2Si(C_2H_5)_2$, bis(butylamino)diethylsilane: $[(C_4H_9)_2HN]_2Si(C_2H_5)_2$, bis(diethylamino)diethylsilane: $[(C_2H_5)_2N]_2Si(C_2H_5)_2$, bis(dipropylamino)diethylsilane: $[(C_3H_7)_2N]_2Si(C_2H_5)_2$, bis(dibutylamino)diethylsilane: $[(C_3H_7)_2N]_2Si(C_2H_5)_2$, bis(dimethylamino)ethylsilane: $[(CH_3)_2N]_2SiH(C_2H_5)$, bis(ethylamino)ethylsilane: $[(C_2H_5)HN]_2SiH(C_2H_5)$, bis(propylamino)ethylsilane: $[(C_3H_7)_2HN]_2SiH(C_2H_5)$, bis(butylamino)ethylsilane: $[(C_4H_9)_2HN]_2SiH(C_2H_5)$, bis(diethylamino)ethylsilane: $[(C_2H_5)_2N]_2SiH(C_2H_5)$, bis(dipropylamino)ethylsilane: $[(C_3H_7)_2N]_2SiH(C_2H_5)$, bis(dibutylamino)ethylsilane: $[(C_3H_7)_2N]_2SiH(C_2H_5)$, bis(diethylamino)silane: $[(C_2H_5)_2N]_2SiH_2$, bis(dipropylamino)silane: $[(C_3H_7)_2N]_2SiH_2$, bis(dibutylamino)silane: $[(C_4H_9)_2N]_2SiH_2$, bis(dipentylamino)silane: $[(C_5H_{11})_2N]_2SiH_2$, or the like.

One or more of these can be used as the second precursor. Further, under the same conditions, it may be performed to select the second precursor used in step C so that the adsorption-inhibiting action by the second adsorption-inhibiting layer formed in step C is stronger than the adsorption-inhibiting action by the first adsorption-inhibiting layer formed in step A. Since the adsorption-inhibiting action by the second adsorption-inhibiting layer can be adjusted by the number and type of first substituents contained in the second precursor, the second precursor used in step C can be appropriately selected according to the number and type of first substituents contained in the first precursor used in step A. Specifically, if the first precursor and the second precursor have the same number of first substituents and the first precursor contains only the hydrogen group as the first substituent, it may be performed to select the second precursor containing only the alkyl group as the first substituent, or containing the alkyl group and the hydrogen group as the first substituent. This is because in comparison among the alkyl group and the hydrogen group, the alkyl group has the stronger adsorption-inhibiting action. Further, if both the first precursor and the second precursor contain the same first substituent (for example, the alkyl group), it may be performed to select the second precursor having the number of first substituents larger than the number of first substituents in the first precursor. This is because the larger the number of first substituents, the stronger the adsorption-inhibiting action of the formed adsorption-inhibiting layer.

Further, it may be performed to use the second precursor having the number of second substituents contained in one molecule, which is equal to or smaller than the number of second substituents contained in the first precursor used in step A. This is because the fewer the second substituents contained in one molecule, the more the first substituents contained in one molecule, and thus the stronger the adsorption-inhibiting action of the adsorption-inhibiting layer. By doing so, under the same conditions, the adsorption-inhibiting action by the second adsorption-inhibiting layer formed in step C is made stronger than the adsorption-inhibiting action by the first adsorption-inhibiting layer formed in step A that makes it easier to selectively form the film on the surface of the first base in step D.

In step C, if the second precursor containing a fluoro group, a fluoroalkyl group, a hydrogen group, or the like as the first substituent cannot stably exist as a single compound, a second precursor that contains other first substituent and can stably exist as a single compound may be adsorbed on the adsorption-promoting layer and then subjected to specific treatment to convert the other first substituent into the hydrogen group, the fluoro group, or the fluoroalkyl group. Examples of methods for converting the first substituent in the second precursor are the same as the above-described examples of the methods for converting the first substituent in the first precursor.

(Step D)

After steps A, B, and C are performed sequentially, the opening/closing operation of the valve in the film-forming substance supply system is controlled to supply the film-forming substance to the wafer 200 in the process chamber 201. The film-forming substance supplied to the wafer 200 is exhausted through the exhaust port 231*a*. At this time, the inert gas may be supplied into the process chamber 201 from the inert gas supply system.

Figure 4E:
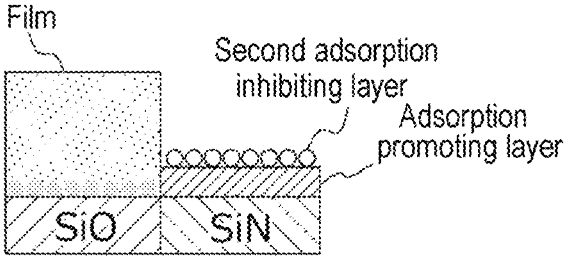
Figure 5A:
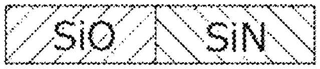
FIGS. 5A to 5F are schematic cross-sectional views showing a surface portion of a wafer in each step in selective growth according to a second embodiment of the present disclosure.
Figure 5B:
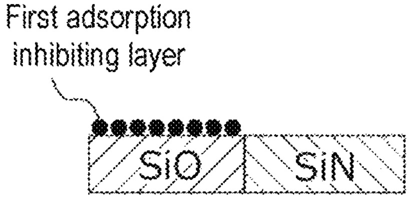
Figure 5C:
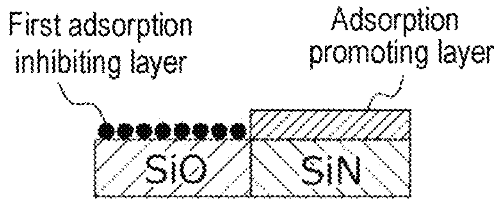
Figure 5D:
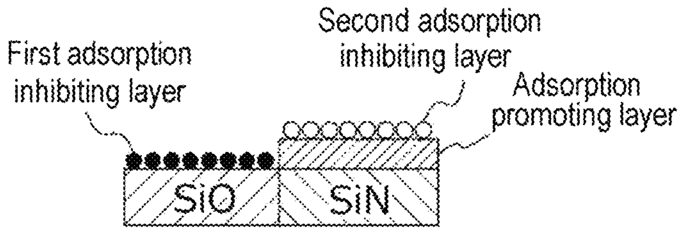
Figure 5E:
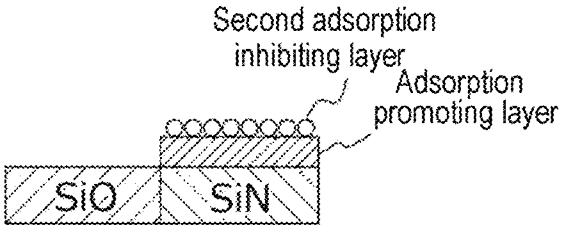
Figure 5F:
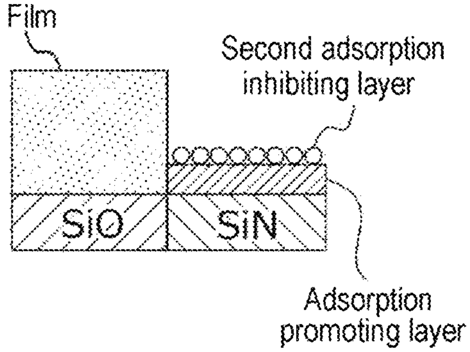
Figure 6A:
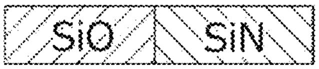
FIGS. 6A to 6F are schematic cross-sectional views showing the surface portion of the wafer in each step in selective growth according to the second embodiment of the present disclosure.
Figure 6B:
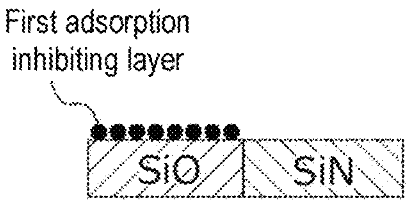
Figure 6C:
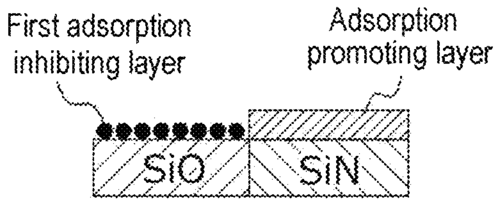
Figure 6D:
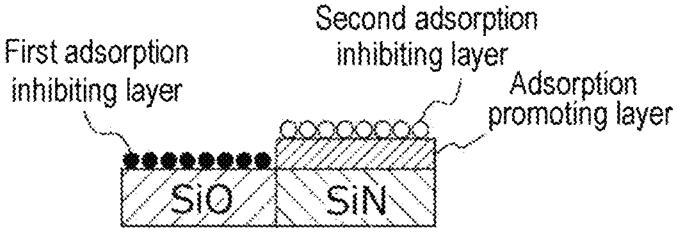
Figure 6E:
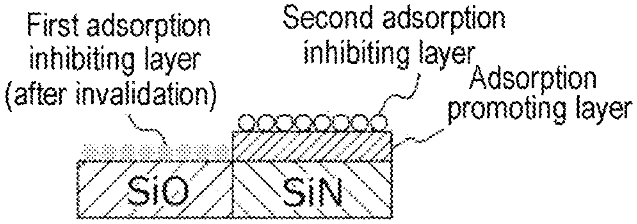
Figure 6F:
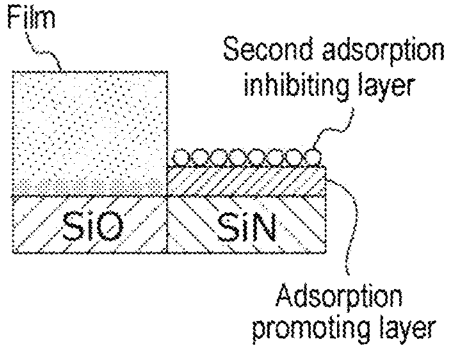

In step D, by the action of the film-forming substance, by invalidating the action of the first adsorption-inhibiting layer without invalidating the action of the second adsorption-inhibiting layer, as shown in FIG. 4E, the film is selectively (preferentially) formed on the surface of the SiO film that is the first base. That is, in step D, by cancelling the adsorption-inhibiting action of the first adsorption-inhibiting layer while maintaining the adsorption-inhibiting action of the second adsorption-inhibiting layer, the film is selectively formed on the surface of the SiO film that is the first base. The action of the film-forming substance includes a chemical action of the film-forming substance and a physical action of the film-forming substance. Further, an invalidation of the action of the adsorption-inhibiting layer means an invalidation of the adsorption-inhibiting action of the adsorption-inhibiting layer. An invalidation of the adsorption-inhibiting action of the adsorption-inhibiting layer includes, for example, making a surface of a base on which the adsorption-inhibiting layer is formed into a state in which a substance can be adsorbed on the surface of the base, by altering or destroying a molecular structure of molecules contained in the adsorption-inhibiting layer by the action of the film-forming substance, and making the surface of the base on which the adsorption-inhibiting layer is formed into a state in which the substance can be adsorbed on the surface of the base, by altering or destroying the molecular structure of molecules contained in the adsorption-inhibiting layer to remove the adsorption-inhibiting layer by the action of the film-forming substance.

As described above, in the first embodiment, the adsorption-inhibiting action of the first adsorption-inhibiting layer may be weaker than the adsorption-inhibiting action of the second adsorption-inhibiting layer. The film can be selectively formed on the surface of the SiO film, which is the first base, by utilizing a difference in adsorption-inhibiting action between the first adsorption-inhibiting layer and the second adsorption-inhibiting layer.

The film formed in step D may be formed by supplying the film-forming substance to the wafer 200, and a method of forming the film is not particularly limited. Here, the film-forming substance includes a raw material gas, a reaction gas, a catalyst gas, or the like. For example, in step D, it may be performed to supply the catalyst gas together with at least one of the raw material gas and the reaction gas by alternately supplying the raw material gas and the reaction gas as film-forming substances to the wafer 200 or by alternately supplying the raw material gas and the reaction gas as film-forming gases to the wafer 200. However, depending on the processing condition, the supply of the catalyst gas may not be performed and can be omitted. For example, in step D, any of the following processing sequences may be performed. It should be noted that the following processing sequences show only step D extracted.

(Raw material gas→Reaction gas)×$n$ (Raw material gas→Reaction gas+Catalyst gas)×$n$ (Raw material gas+Catalyst gas→Reaction gas)×$n$ (Raw material gas+Catalyst gas→Reaction gas+Catalyst gas)×$n$ In the following, an example will be described in which, in step D, the raw material gas and the reaction gas are alternately supplied as film-forming substances, and the catalyst gas is supplied together with each of the raw material gas and the reaction gas. Specifically, as step D, an example of performing a cycle a predetermined number of times (n times, where n is an integer of 1 or more), the cycle including non-simultaneously performing step D1 of supplying the raw material gas and the catalyst gas to the wafer 200 and step D2 of supplying the reaction gas and the catalyst gas to the wafer 200, will be described.

(Step D1)

After step C is completed, the raw material gas and the catalyst gas are supplied as the film-forming substances to the wafer 200 into the process chamber 201 from the film-forming substance supply system. The raw material gas and the catalyst gas supplied to the wafer 200 are exhausted through the exhaust port 231*a*. At this time, the inert gas may be supplied into the process chamber 201 from the inert gas supply system.

After supplying the raw material gas and the catalyst gas to the wafer 200 for a predetermined time, a supply of the raw material gas and the catalyst gas into the process chamber 201 is stopped. Then, the raw material gas, the catalyst gas, and the like remaining in the process chamber 201 are removed from the process chamber 201 (purging) according to the same processing procedure and processing condition as the purging in the above-described step A.

A processing condition for supplying the raw material gas and the catalyst gas in step D1 is exemplified as follows.

Processing temperature: 25 to 200 degrees C., specifically 25 to 120 degrees C.
Processing pressure: 133 to 1,333 Pa
Raw material gas supply flow rate: 1 to 2,000 sccm
Raw material gas supply time: 1 to 120 seconds
Catalyst gas supply flow rate: 1 to 2,000 sccm
Inert gas supply flow rate (for each gas supply pipe): 0 to 20,000 sccm —Raw Material Gas—

As the raw material gas, for example, a Si-containing gas can be used. Examples of the Si-containing gas may include a Si- and halogen-containing gases, a Si- and amino group-containing gas, and a Si- and alkoxy group-containing gas. Halogen includes chlorine (Cl), fluorine (F), bromine (Br), iodine (I), or the like. The amino group includes a substituted amino group. A substituent of the substituted amino group may be an alkyl group, more preferably an alkyl group containing 1 to 5 carbon atoms, and particularly preferably an alkyl group containing 1 to 4 carbon atoms. The alkyl group of the substituted amino group may be linear or branched. Examples of the alkyl group of the substituted amino group may include a methyl group, an ethyl group, an n-propyl group, an n-butyl group, an isopropyl group, an isobutyl group, a sec-butyl group, a tert-butyl group, or the like. The alkoxy group includes a methoxy group, an ethoxy group, a propoxy group, or the like.

The Si- and halogen-containing gas, the Si- and amino group-containing gas, and the Si- and alkoxy group-containing gas may contain a chemical bond between Si and halogen, a chemical bond between Si and an amino group, and a chemical bond between Si and an alkoxy group, respectively. These Si-containing gases may further contain C, in which case may contain C in a form of a Si—C bond. As the Si- and C-containing gas, for example, an alkylenesilane-based gas containing an alkylene group and containing a Si—C bond can be used. The alkylene group includes a methylene group, an ethylene group, a propylene group, a butylene group, or the like. The alkylenesilane-based gas may contain Si and halogen, Si and an amino group, Si and an alkoxy group, or the like in a form of a direct bond, and C in the form of the Si—C bond.

Examples of the Si- and halogen-containing gas may include dichlorosilane: $SiH_2Cl_2$, trichlorosilane: $SiHCl_3$, tetrachlorosilane: $SiCl_4$, tetrabromosilane: $SiBr_4$, hexachlorodisilane: $(SiCl_3)_2$, octachlorotrisilane: $Si_3Cl_8$, hexachlorodisiloxane: $(SiCl_3)_2O$, octachlorotrisiloxane: $(SiCl_3O)_2SiCl_2$, or the like. Examples of the Si- and amino group-containing gas may include tetrakis(dimethylamino)silane: $Si[N(CH_3)_2]_4$, tetrakis(diethylamino)silane: $Si[N(C_2H_5)_2]_4$, or the like. Examples of the Si- and alkoxy group-containing gas may include tetramethoxysilane: $Si(OCH_3)_4$, tetraethoxysilane: $Si(OC_2H_5)_4$, (dimethylamino)trimethoxysilane: $[(CH_3)_2N]Si(OCH_3)_3$, (dimethylamino)triethoxysilane: $[(CH_3)_2N]Si(OC_2H_5)_3$, or the like. Examples of the Si-, C-, and halogen-containing gas may include bistrichlorosilylmethane: $(SiCl_3)_2CH_2$, bistrichlorosilylethane: $(SiCl_3)C_2H_5$, bis[(trichlorosilyl)methyl]dichlorosilane: $[(SiCl_3)_3CH_2]_2SiCl_2$,1,1,2,2-tetrachloro-1,2-dimethyldisilane: $(CH_3)_2Si_2Cl_4$,1,2-dichloro-1,1,2,2-tetramethyldisilane: $(CH_3)_4Si_2Cl_2$,1,1,3,3-tetrachloro-1,3-disilacyclobutane: $C_2H_4Cl_4Si_2$, or the like. One or more of these can be used as the raw material gas.

—Catalyst Gas—

As the catalyst, for example, an amine-based gas containing C, N, and H can be used. Examples of the amine-based gas may include dimethylamine: $C_2H_7N$, diethylamine: $C_4H_{11}N$, dipropylamine: $C_6H_{15}N$, pyridine: $C_5H_5N$, piperidine: $C_6H_{12}N$, pyrrolidine: $C_4H_9N$, aniline: $C_6H_7N$, picoline: $C_6H_7N$, aminopyridine: $C_5H_6N_2$, lutidine: $C_7H_9N$, piperazine: $C_4H_{10}N_2$, or the like. One or more of these can be used as the catalyst gas.

(Step D2)

After step D1 is completed, the reaction gas and the catalyst gas are supplied as the film-forming substances to the wafer 200 in the process chamber 201 from the film-forming substance supply system. The reaction gas and the catalyst gas supplied to the wafer 200 are exhausted through the exhaust port 231*a*. At this time, the inert gas may be supplied into the process chamber 201 from the inert gas supply system.

After supplying the reaction gas and the catalyst gas to the wafer 200 for a predetermined time, a supply of the reaction gas and the catalyst gas into the process chamber 201 is stopped. Then, the reaction gas, the catalyst gas, and the like remaining in the process chamber 201 are removed from the process chamber 201 (purging) according to the same processing procedure and processing condition as the purging in the above-described step A.

A processing condition for supplying the reaction gas and the catalyst gas in step D2 is exemplified as follows.

Processing temperature: 25 to 200 degrees C., specifically 25 to 120 degrees C.
Processing pressure: 133 to 1,333 Pa
Reaction gas supply flow rate: 1 to 2,000 sccm
Reaction gas supply time: 1 to 120 seconds
Catalyst gas supply flow rate: 1 to 2,000 sccm Inert gas supply flow rate (for each gas supply pipe): 0 to 20,000 sccm —Reaction Gas—

As the reaction gas, when forming an oxide film, for example, an O- and H-containing gas can be used. As the O- and H-containing gas, for example, an O-containing gas containing an O—H bond, such as a $H_2O$ gas, a $H_2O_2$ gas, or the like, can be used. As the O- and H-containing gas, an O-containing gas that does not contain an O—H bond, such as a $H_2$ gas+$O_2$ gas, a $H_2$ gas+$O_3$ gas, or the like, can also be used.

Further, as the reaction gas, when forming a nitride film, for example, a nitriding agent (nitriding gas) can be used. As the nitriding agent, for example, a N- and H-containing gas can be used. Examples of the N- and H-containing gas may include hydrogen nitride-based gases containing a N—H bond, such as an ammonia ($NH_3$) gas, a hydrazine ($N_2H_4$) gas, a diazene ($N_2H_2$) gas, and a $N_3H_8$ gas, can be used. One or more of these gases can be used as the reaction gas.

—Catalyst Gas—

As the catalyst gas, for example, the same catalyst gas as the various catalyst gases exemplified in the above-described step D1 can be used.

[Performing Predetermined Number of Times]

By performing a cycle a predetermined number of times (n times, where n is an integer of 1 or more), the cycle including non-simultaneously, that is, without synchronization, performing the above-described step D1 and step D2, it is possible to selectively form the film having a desired thickness on the surface of the SiO film, which is the first base, as shown in FIG. 4E.

In the process of performing the above-described cycle the predetermined number of times, the adsorption-inhibiting action of the first adsorption-inhibiting layer formed on the surface of the first base can be invalidated (cancelled). After the adsorption-inhibiting action of the first adsorption-inhibiting layer is invalidated, a first layer is formed on the surface of the first base in step D1, and the first layer formed on the surface of the first base is changed to a second layer in step D2. By performing these steps a predetermined number of times, the film is formed by laminating the second layer on the first base. During this time, the adsorption-inhibiting action of the second adsorption-inhibiting layer formed on the surface of the second base can be maintained to inhibit a formation of the film on the surface of the second base. The above cycle may be repeated a plurality of times. That is, the thickness of the second layer formed per cycle may be set to be smaller than the desired film thickness, and the above cycle may be repeated a plurality of times until the thickness of the film formed on the first base by stacking second layers reaches the desired film thickness.

Further, by performing the above-described cycle the predetermined number of times, a very slight film may be formed on the surface of the second base. However, even in this case, the film thickness of the film formed on the surface of the second base is much thinner than the film thickness of the film formed on the surface of the first base. In the present disclosure, "high selectivity in selective growth" means not only a case where no film is formed on the surface of the second base, but the film is formed only on the surface of the first base, but also, as described above, a case where the very thin film is formed on the surface of the second base, but a much thicker film is formed on the surface of the first base.

In step D, a material of the film (a type of the film) to be obtained differs depending on a type of raw material gas and reaction gas. For example, in step D, a silicon oxycarbide film (SiOC film) can be formed as the film by using a Si-, C-, and halogen-containing gas as the raw material gas and the O-containing gas as the reaction gas. Further, for example, in step D, a silicon carbonitride film (SiCN film) can be formed as the film by using the Si-, C-, and halogen-containing gas as the raw material gas and the N- and H-containing gas as the reaction gas. Further, for example, in step D, a silicon oxycarbonitride film (SiOCN film) can be formed as the film by using the Si-, C-, and halogen-containing gas as the raw material gas and the O-containing gas and the N- and H-containing gas as the reaction gas. Further, for example, in step D, a silicon oxide film (SiO film) can be formed as the film by using the Si- and halogen-containing gas as the raw material gas and the O-containing gas as the reaction gas. Further, for example, in step D, a silicon nitride film (SiN film) can be formed as the film by using the Si- and halogen-containing gas as the raw material gas and the N- and H-containing gas as the reaction gas. In this way, in step D, various types of films such as a silicon-based oxide film and a silicon-based nitride film can be formed. As described above, depending on the processing condition, the catalyst gas may not be supplied. If the catalyst gas is not used, the processing temperature in step D can be set to a predetermined temperature within a range of, for example, 200 to 500 degrees C.

Further, in step D, by using the raw material gas containing a metal element such as Al, Ti, Hf, Zr, Ta, Mo, W, or the like as the raw material gas and the O-containing gas or the N- and H-containing gas as the reaction gas, for example, a metal-based oxide film such as an aluminum oxide film (AlO film), a titanium oxide film (TiO film), a hafnium oxide film (HfO film), a zirconium oxide film (ZrO film), a tantalum oxide film (TaO film), a molybdenum oxide film (MoO), a tungsten oxide film (WO), a metal-based nitride film such as an aluminum nitride film (AlN film), a titanium nitride film (TiN film), a hafnium nitride film (HfN film), a zirconium nitride film (ZrN film), a tantalum nitride film (TaN film), a molybdenum nitride film (MoN), or a tungsten nitride film (WN), or the like can be formed as the film. As described above, depending on the processing condition, the catalyst gas may not be supplied. If the catalyst gas is not used, the processing temperature in step D can be set to the predetermined temperature within the range of, for example, 200 to 500 degrees C.

(After-Purging and Returning to Atmospheric Pressure)

After the film is selectively formed on the surface of the SiO film that is the first base on the surface of the wafer 200, the inert gas as the purge gas is supplied into the process chamber 201 from the inert gas supply system and is exhausted through the exhaust port 231*a*. Thus, the interior of the process chamber 201 is purged and a gas, reaction by-products, and the like remaining in the process chamber 201 are removed from the process chamber 201 (after-purging). After that, the internal atmosphere of the process chamber 201 is substituted with the inert gas (inert gas substitution) and the internal pressure of the process chamber 201 is returned to the atmospheric pressure (returning to atmospheric pressure).

(Boat Unloading and Wafer Discharging)

After that, the seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219*s* is moved and the lower end opening of the manifold 209 is sealed by the shutter 219*s* via the O-ring 220*c* (shutter close). The processed wafers 200 are unloaded from the reaction tube 203 and are then discharged from the boat 217 (wafer discharging).

Effects of First Embodiment

According to the first embodiment, one or more effects set forth below may be achieved.

By forming the first adsorption-inhibiting layer on the surface of the first base, it is possible to selectively form the adsorption-promoting layer on the surface of the second base, and it is possible to selectively form the second adsorption-inhibiting layer on the surface of the adsorption-promoting layer. That is, it is possible to selectively form the second adsorption-inhibiting layer on the outermost surface of the second base (specific base). Thereafter, by supplying the film-forming substance, it is possible to selectively form the film on the surface of the first base (desired base).

The adsorption-inhibiting action of the first adsorption-inhibiting layer can be cancelled by the action of the film-forming substance, thereby making it possible to form the film on the surface of the first base. At this time, by maintaining the adsorption-inhibiting action of the second adsorption-inhibiting layer formed on the surface of the second base, it is possible to inhibit the formation of the film on the surface of the second base. That is, it is possible to selectively form the film on the surface of the first base without separately performing a step of removing the first adsorption-inhibiting layer, or the like. This makes it possible to shorten a processing time, thereby improving a throughput, that is, a productivity.

By performing each of the above-described steps on the wafer 200 whose first base is an oxygen-containing film and whose second base is an oxygen-free film, it is possible to cause the above-described chemical reaction and the like more appropriately. As a result, the above-described effects can be obtained remarkably. By performing each of the above-described steps on the wafer 200 whose first base is at least one selected from the group of, for example, a SiO film, a SiOC film, and an AlO film and whose second base is at least one selected from the group of, for example, a silicon film (Si film), a SiN film, and a metal film, it becomes possible to cause the above-described chemical reaction and the like furthermore appropriately. As a result, the above-described effects can be obtained more remarkably.

Under the same conditions, the adsorption-inhibiting action of the first adsorption-inhibiting layer formed in step A may be weaker than the adsorption-inhibiting action of the second adsorption-inhibiting layer formed in step C. Moreover, under the same conditions, the first adsorption-inhibiting layer formed in step A may desorb more easily than the second adsorption-inhibiting layer formed in step C. Further, under the same conditions, the reactivity between the film-forming substance used in step D and the first adsorption-inhibiting layer formed in step A may be higher than the reactivity between the film-forming substance used in step D and the second adsorption-inhibiting layer formed in step C. As a result, it is possible to efficiently invalidate the adsorption-inhibiting action of the first adsorption-inhibiting layer in step D.

Second Embodiment of the Present Disclosure

Next, a second embodiment of the present disclosure will be described mainly with reference to FIGS. 5A to 5F and 6A to 6F.

As in FIGS. 5A to 5F, FIGS. 6A to 6F, and a processing sequence shown below, the processing sequence in the second embodiment further includes: after performing steps A, B, and C and before performing step D, step E of performing at least one selected from the group of removing the first adsorption-inhibiting layer and invalidating the action of the first adsorption-inhibiting layer (hereinafter also referred to as removing and/or invalidating the first adsorption-inhibiting layer).

First adsorption-inhibiting layer→formation Adsorption-promoting layer formation→Second adsorption-inhibiting layer formation→First adsorption-inhibiting layer removal and/or invalidation→Film formation Further, as in FIGS. 5A to 5F and a processing sequence shown below, the first adsorption-inhibiting layer may be removed in step E.

First adsorption-inhibiting layer formation→Adsorption-promoting layer formation→Second adsorption-inhibiting layer formation→First adsorption-inhibiting layer removal→Film formation Further, as in FIGS. 6A to 6F and a processing sequence shown below, the action of the first adsorption-inhibiting layer may be invalidated in step E.

First adsorption-inhibiting layer formation→Adsorption-promoting layer formation→Second adsorption-inhibiting layer formation→First adsorption-inhibiting layer invalidation→Film formation Further, as in a processing sequence shown below, both removal of the first adsorption-inhibiting layer and the invalidation of the action of the first adsorption-inhibiting layer may be performed in step E. In this case, the first adsorption-inhibiting layer is removed in a portion of the surface of the first base, and the action of the first adsorption-inhibiting layer is invalidated on the other part of the surface of the first base.

First adsorption-inhibiting layer formation→Adsorption-promoting layer formation→Second adsorption-inhibiting layer formation→First adsorption-inhibiting layer removal and invalidation→Film formation (Steps A, B, C)

Steps A, B, and C can be performed under the same processing procedures and processing conditions as steps A, B, and C in the first embodiment.

(Step E)

After performing steps A, B, and C, step E is performed. In step E, at least one selected from the group of removing the first adsorption-inhibiting layer and invalidating the action of the first adsorption-inhibiting layer is performed.

There is no particular limitation on a method of removing and/or invalidating the first adsorption-inhibiting layer. Examples of the method of removing and/or invalidating the first adsorption-inhibiting layer may include annealing treatment, oxidation treatment, denaturation treatment, or the like. By these treatments, at least one selected from the group of removal of the first adsorption-inhibiting layer, denaturation of the first substituent contained in the first adsorption-inhibiting layer, and scission (dissociation) of a bond between the residue derived from the first precursor contained in the first adsorption-inhibiting layer and the first base can be performed. Further, the above-mentioned annealing treatment, oxidation treatment, and denaturation treatment may not degrade the adsorption-inhibiting action of the second adsorption-inhibiting layer formed on the surface of the second base. For this purpose, in the above-mentioned annealing treatment, oxidation treatment, and denaturation treatment, it may be performed to remove and/or invalidate the first adsorption-inhibiting layer by using at least one selected from the group of a difference in heat resistance, difference in oxidation resistance, and difference in reactivity with a specific substance between the first adsorption-inhibiting layer and the second adsorption-inhibiting layer, without degrading the adsorption-inhibiting action of the second adsorption-inhibiting layer formed on the surface of the second base.

In step E, when supplying an invalidating substance (as described above, for the sake of convenience, this term is used as a generic term for removing and/or invalidating substance) to the wafer 200, the opening/closing operation of the valve in the processing substance supply system may be controlled to supply the invalidating substance to the wafer 200 in the process chamber 201. The invalidating substance supplied to the wafer 200 is exhausted through the exhaust port 231*a*. At this time, the inert gas may be supplied into the process chamber 201 from the inert gas supply system.

[Annealing Treatment]

In step E, annealing treatment, preferably annealing treatment under the inert gas atmosphere, can be performed to remove and/or invalidate the first adsorption-inhibiting layer. The inert gas can be supplied into the process chamber 201 from the inert gas supply system. At this time, the inert gas is supplied to the wafer 200 to form the inert gas atmosphere in the process chamber 201.

A processing condition for the annealing treatment is exemplified as follows.

- Processing temperature: 100 to 600 degrees C., specifically 200 to 500 degrees C.
- Processing pressure: 1 to 101,325 Pa, specifically 1 to 13,300 Pa
- Inert gas supply flow rate (for each gas supply pipe): 0 to 20,000 sccm
- Inert gas supply time: 1 to 240 minutes, specifically 30 to 120 minutes The annealing treatment in step E is suitable for a case where, for example, the first substituent contained in the first adsorption-inhibiting layer is the hydrogen group or the alkoxy group and the first substituent contained in the second adsorption-inhibiting layer is the alkyl group or the fluoroalkyl group. Further, the annealing treatment in step E is suitable for a case where the number of second substituents contained in the first adsorption-inhibiting layer is 2 or 3 and the number of second substituents contained in the second adsorption-inhibiting layer is 1.

[Oxidation Treatment]

In step E, oxidation treatment can be performed to remove and/or invalidate the first adsorption-inhibiting layer. Examples of the oxidation treatment may include a method of immersing the wafer 200 in water, a method of exposing the wafer 200 to the atmosphere, a method of supplying an oxidizing agent to the wafer 200, a method of simultaneously supplying the oxidizing agent and a catalyst gas to the wafer 200, or the like. An O-containing substance can be used as an oxidizing agent that acts as the invalidating substance. As the O-containing substance, for example, the same O-containing substance as the various types of O-containing substances exemplified in the above-described step B can be used. Further, as the catalyst gas, for example, the same catalyst gas as the various types of catalyst gases exemplified in the above-described step D1 can be used. The oxidizing agent and the catalyst gas can be supplied using the above-described processing substance supply system.

A processing condition for performing the oxidation treatment using the O-containing substance as the oxidizing agent is exemplified as follows.

- Processing temperature: 25 to 800 degrees C., specifically 25 to 600 degrees C.
- Processing pressure: 1 to 101,325 Pa, specifically 1 to 1,300 Pa
- O-containing substance supply flow rate: 1 to 20,000 sccm
- O-containing substance supply time: 1 to 120 seconds
- Inert gas supply flow rate (for each gas supply pipe): 0 to 20,000 sccm A processing condition for performing the oxidation treatment using the O-containing substance and the catalyst gas as the oxidizing agent is exemplified as follows.

- Processing temperature: 25 to 200 degrees C., specifically 25 to 120 degrees C.
- Processing pressure: 1 to 101,325 Pa, specifically 1 to 13,300 Pa
- substance supply flow rate: 1 to 20,000 sccm
- substance supply time: 1 second to 24 hours
- Catalyst gas supply flow rate: 1 to 20,000 sccm
- Inert gas supply flow rate (for each gas supply pipe): 0 to 20,000 sccm The oxidation treatment in step E is suitable for a case where, for example, the first substituent contained in the first adsorption-inhibiting layer is the hydrogen group or the alkoxy group and the first substituent contained in the second adsorption-inhibiting layer is the alkyl group or the fluoroalkyl group.

[Denaturation Treatment]

In step E, denaturation treatment can be performed to remove and/or invalidate the first adsorption-inhibiting layer. Some of the residues derived from the first precursor contained in the first adsorption-inhibiting layer can be denatured by this denaturation treatment. The denaturation treatment can be performed by supplying a halogen-containing gas to the wafer 200. Examples of the halogen-containing gas that act as the invalidating substance may include a $F_2$ gas, a HF gas, a chlorine trifluoride ($ClF_3$) gas, a boron trifluoride ($BCl_3$) gas, a chlorine ($Cl_2$) gas, a hydrogen chloride (HCl) gas, a bromine ($Br_2$) gas, a hydrogen bromide (HBr) gas, a tetrachloroethylene ($C_2Cl_4$) gas, or the like. Further, in the denaturation treatment, the halogen-containing gas and a catalyst gas may be supplied to the wafer 200 at the same time. The halogen-containing gas and the catalyst gas can be supplied using the above-described processing substance supply system.

A processing condition for the denaturation treatment using the halogen-containing substance is exemplified as follows.

- Processing temperature: 25 to 400 degrees C., specifically 25 to 200 degrees C.
- Processing pressure: 1 to 13,300 Pa, specifically 50 to 1,330 Pa
- Halogen-containing substance supply flow rate: 1 to 20,000 sccm
- Halogen-containing substance supply time: 1 to 120 seconds
- Catalyst gas supply flow rate: 0 to 20,000 sccm
- Inert gas supply flow rate (for each gas supply pipe): 0 to 20,000 sccm The denaturation treatment in step E is suitable for a case where, for example, the first substituent contained in the first adsorption-inhibiting layer is the hydrogen group and the first substituent contained in the second adsorption-inhibiting layer is the alkyl group or the fluoroalkyl group.

In the second embodiment, unlike the first embodiment, there may not be a sufficient difference between the adsorption-inhibiting action of the first adsorption-inhibiting layer and the adsorption-inhibiting action of the second adsorption-inhibiting layer. However, in step E, from the viewpoint of efficiently removing and/or invalidating the first adsorption-inhibiting layer, the adsorption-inhibiting action of the first adsorption-inhibiting layer may be weaker than the adsorption-inhibiting action of the second adsorption-inhibiting layer.

(Step D)

After step E is performed, step D is performed. In step D in the second embodiment, the film is selectively formed on the surface of the first base on which the adsorption-inhibiting action has been cancelled. At this time, the formation of the film on the surface of the second base can be inhibited by the action of the second adsorption-inhibiting layer formed on the outermost surface of the second base.

Step D can be performed under the same processing procedure and processing condition as those of step D in the first embodiment. However, when forming the film having the same thickness as the film formed in the first embodiment, a processing time of step D in the second embodiment can be shorter than the processing time of step D in the first embodiment.

Effects of Second Embodiment

According to the second embodiment, one or more effects set forth below may be achieved.

The second embodiment can also obtain the same effects as in the above-described first embodiment. Further, according to the second embodiment, by including step E, it is possible to selectively form the film on the surface of the first base without delay and efficiently. Further, in step E, when removing the first adsorption-inhibiting layer, the residues of the first adsorption-inhibiting layer can be prevented from remaining on an interface between the surface of the first base and the film formed on the surface of the first base. This makes it possible to improve the interface characteristics between the surface of the first base and the film formed on the surface of the first base. Further, in step E, when invalidating the action of the first adsorption-inhibiting layer, the invalidating treatment can be completed in a relatively short time as compared to when completely removing the first adsorption-inhibiting layer. This makes it possible to shorten the processing time, thereby improving the throughput, that is, the productivity.

Under the same conditions, the adsorption-inhibiting action of the first adsorption-inhibiting layer formed in step A may be weaker than the adsorption-inhibiting action of the second adsorption-inhibiting layer formed in step C. Further, under the same conditions, the first adsorption-inhibiting layer formed in step A may desorb more easily than the second adsorption-inhibiting layer formed in step C. Further, under the same conditions, the reactivity between the film-forming substance used in step D and the first adsorption-inhibiting layer formed in step A may be higher than the film-forming substance used in step D and the second adsorption-inhibiting layer formed in step C. This makes it possible to efficiently perform the removal and/or invalidation of the first adsorption-inhibiting layer in step E.

Modification 1

Modification 1 of the present disclosure will be described mainly with reference to FIGS. 7A to 7F.

As in FIGS. 7A to 7F and a processing sequence shown below, the processing sequence in Modification 1 further includes: before performing step A, step F of decreasing the adsorption sites (for example, OH terminations) on the surface of the first base.

Figure 7A:
FIGS. 7A to 7F are schematic cross-sectional views showing a surface portion of a wafer in each step of selective growth according to Modification 1 of the present disclosure.
Figure 7B:
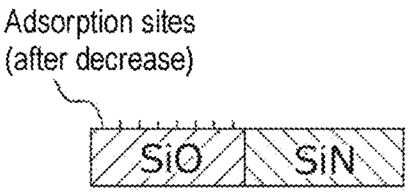
Figure 7C:
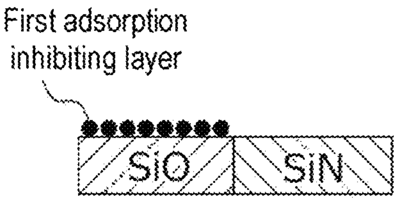
Figure 7D:
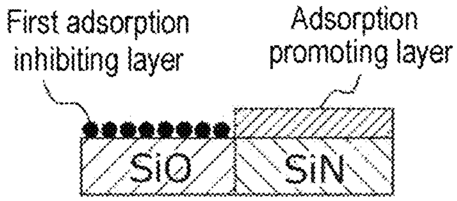
Figure 7E:
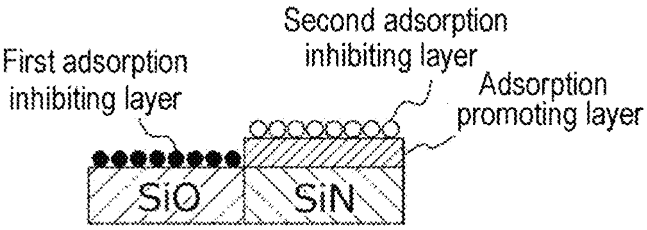
Figure 7F:
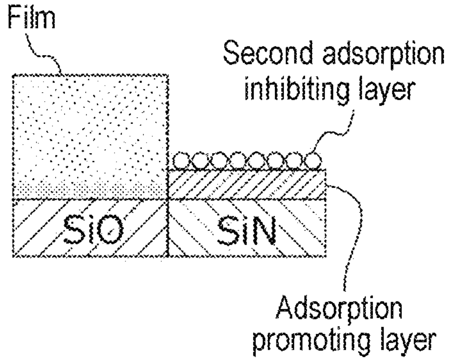

Adsorption site decrease→First adsorption-inhibiting layer formation→Adsorption-promoting layer formation→Second adsorption-inhibiting layer formation→Film formation In step F, by decreasing the adsorption sites on the surface of the first base from a state of FIG. 7A to the state of FIG. 7B, a formation of the second adsorption-inhibiting layer on the surface of the first base can be inhibited. That is, in step C, it is possible to form the second adsorption-inhibiting layer with higher selectivity on the surface of the adsorption-promoting layer formed on the surface of the second base. Examples of a method of decreasing the adsorption sites on the surface of the first base in step F may include annealing treatment and the like.

A processing condition for the annealing treatment in step F is exemplified as follows.

Figure 10A:
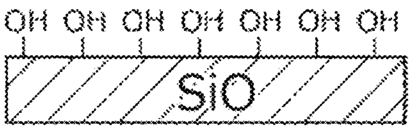
FIG. 10A is a schematic view showing a case where hydroxyl group (OH) terminations, which are the adsorption sites, are densely present on the surface of the SiO film as the first base after step F is performed.
Figure 10B:
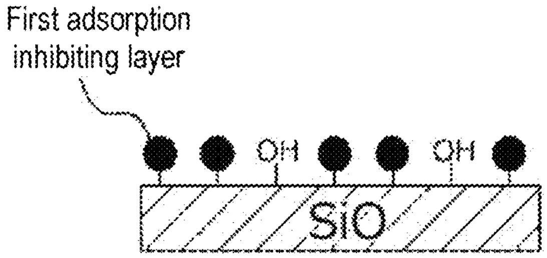
FIG. 10B is a schematic view showing a case where the adsorption sites remain on the surface of the SiO film after step A is performed from a state of FIG. 10A.
Figure 10C:
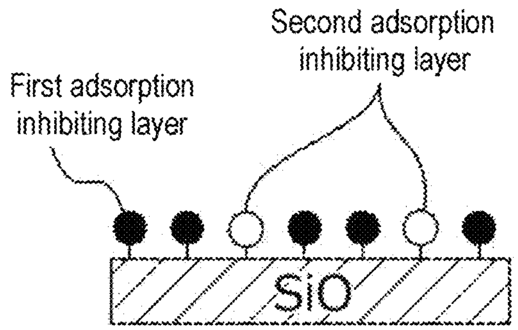
FIG. 10C is a schematic view showing a case where the second adsorption-inhibiting layer is formed on the adsorption sites remaining on the surface of the SiO film by performing steps B and C sequentially from a state of FIG. 10B.

- Processing temperature: 100 to 500 degrees C., specifically 200 to 500 degrees C.
- Processing pressure: 1 to 101,325 Pa, specifically 1 to 13,300 Pa
- Inert gas supply flow rate (for each gas supply pipe): 0 to 20,000 sccm
- Processing time: 1 to 240 minutes, specifically 30 to 120 minutes Here, if the processing temperature is less than 100 degrees C., an effect of decreasing the adsorption sites on the surface of the first base becomes insufficient, and as shown in FIG. 10A, the adsorption sites (OH terminations) may remain densely on the surface of the first base. In this case, after step A is completed, as shown in FIG. 10B, the adsorption sites (OH terminations) may remain on the surface of the first base. In this state, when steps B and C are performed sequentially, as shown in FIG. 10C, at least the portion of the molecular structure of the molecules constituting the second precursor (for example, the residues derived from the second precursor) may be adsorbed on the adsorption sites (OH terminations) remaining on the surface of the first base. In this case, not only the first adsorption-inhibiting layer but also the second adsorption-inhibiting layer is formed on the surface of the first base, resulting in a decrease in selectivity. It is possible to solve this problem by setting the processing temperature to 100 degrees C. or higher. It is possible to sufficiently solve this problem by setting the processing temperature to 200 degrees C. or higher.

Figure 11A:
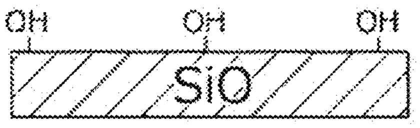
FIG. 11A is a schematic view showing a case where the OH terminations, which are the adsorption sites, are sparsely present on the surface of the SiO film as the first base after step F is performed.
Figure 11B:
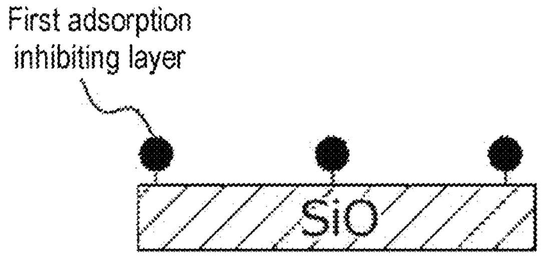
FIG. 11B is a schematic view showing a case where a gap between first adsorption-inhibiting layers formed on the surface of the SiO film is wide open to expose a portion of the surface of the SiO film widely, after step A is performed from a state of FIG. 11A.
Figure 11C:
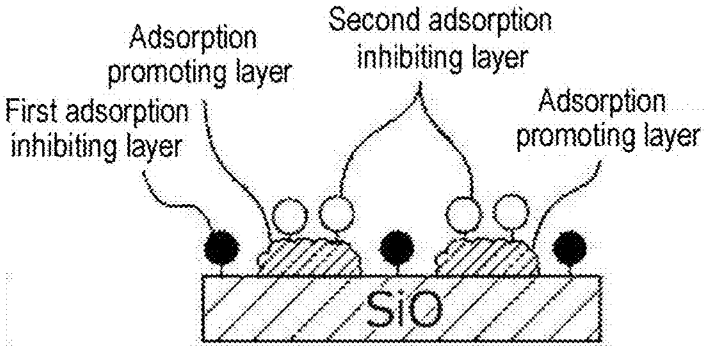
FIG. 11C is a schematic view showing a case where the adsorption-promoting layer and the second adsorption-inhibiting layer are formed in a region where the first adsorption-inhibiting layer is not formed on the surface of the SiO film (a region where the portion of the surface of the SiO film is widely exposed), by performing steps B and C sequentially from a state of FIG. 11B.

On the other hand, if the processing temperature is higher than 500 degrees C., the effect of decreasing the adsorption sites on the surface of the first base becomes excessive, and as shown in FIG. 11A, the adsorption sites (OH terminations) may remain sparsely on the surface of the first base. Therefore, after step A is completed, as shown in FIG. 11B, a distance between at least portions of the molecular structure of the molecules constituting the first precursor adsorbed on the surface of the first base (for example, the residues derived from the first precursor) may become too wide. That is, the surface of the first base may include a wide portion where the first adsorption-inhibiting layer is not formed. In this state, when steps B and C are performed sequentially, as shown in FIG. 11C, in step B, the adsorption-promoting layer may be formed on a portion of the surface of the first base where the first adsorption-inhibiting layer is not formed, and in step C, at least the portion of the molecular structure of the molecules constituting the second precursor may be adsorbed on the surface of the adsorption-promoting layer. In this case, not only the first adsorption-inhibiting layer but also the second adsorption-inhibiting layer is formed on the surface of the first base, resulting in a decrease in selectivity. It is possible to solve this problem by setting the processing temperature to 500 degrees C. or lower.

Figure 12A:
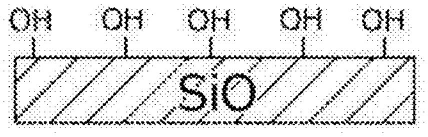
FIG. 12A is a schematic view showing a case where the OH terminations, which are the adsorption sites, are moderately present on the surface of the SiO film as the first base after step F is performed.
Figure 12B:
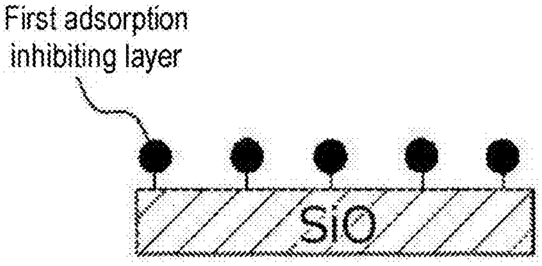
FIG. 12B is a schematic view showing a case where the first adsorption-inhibiting layer is properly formed on the surface of the SiO film after step A is performed from a state of FIG. 12A.
Figure 12C:
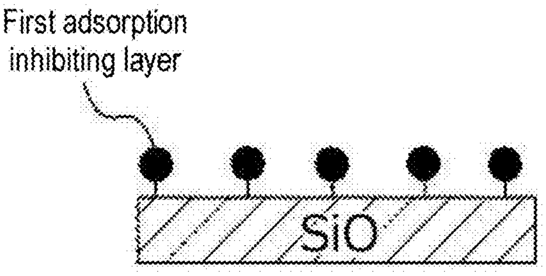
FIG. 12C is a schematic view showing a case where a formation of the adsorption-promoting layer and the second adsorption-inhibiting layer on the surface of the SiO film is inhibited and only the first adsorption-inhibiting layer is formed on the surface of the SiO film by performing steps B and C sequentially from a state of FIG. 12B.

For these reasons, it is desirable to set the processing temperature of the annealing treatment to 100 degrees C. or higher and 500 degrees C. or lower, preferably 200 degrees C. or higher and 500 degrees C. or lower. As a result, as shown in FIG. 12A, it is possible to appropriately decrease the adsorption sites (OH terminations) on the surface of the first base, and as shown in FIG. 12B, after step A is completed, at least the portion of the molecular structure of the molecules constituting the first precursor is properly adsorbed on the surface of the first base, so that the first adsorption-inhibiting layer is properly formed. In this state, when steps B and C are performed sequentially, as shown in FIG. 12C, it is possible to inhibit the formation of the adsorption-promoting layer and the formation of the second adsorption-inhibiting layer on the surface of the first base, thereby enhancing the selectivity.

After step F is performed, as in the above-described processing sequence, steps A, B, C, and D can be performed in the same manner as in the first embodiment. These steps A, B, C, and D can be performed under the same processing procedures and processing conditions as steps A, B, C, and D in the first embodiment.

Further, in Modification 1, after step F is performed, as in the following processing sequence, steps A, B, C, E, and D can be performed in the same manner as in the second embodiment. These steps A, B, C, E, and D can be performed under the same processing procedures and processing conditions as steps A, B, C, E, and D in the second embodiment.

Adsorption site decrease→First adsorption-inhibiting layer formation→Adsorption-promoting layer formation→Second adsorption-inhibiting layer formation→First adsorption-inhibiting layer removal and/or invalidation→Film formation Modification 1 can also obtain the same effects as in the above-described first and second embodiments. Further, according to Modification 1, it is possible to further enhance the selectivity in selective growth.

Modification 2

Modification 2 of the present disclosure will be described mainly with reference to FIGS. 8A to 8F.

As in FIGS. 8A to 8F and a processing sequence shown below, the processing sequence in Modification 2 further includes: step G of removing the adsorption-promoting layer and the second adsorption-inhibiting layer on the surface of the second base by forming the film, which is different in material from the adsorption-promoting layer, on the surface of the first base in step D after steps A, B, and C are performed and exposing the film on the surface of the first base and the adsorption-promoting layer and the second adsorption-inhibiting layer on the surface of the second base to an etching substance after step D is performed.

Figure 8A:
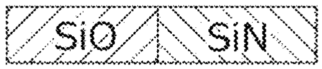
FIGS. 8A to 8F are schematic cross-sectional views showing a surface portion of a wafer in each step of selective growth according to Modification 2 of the present disclosure.
Figure 8B:
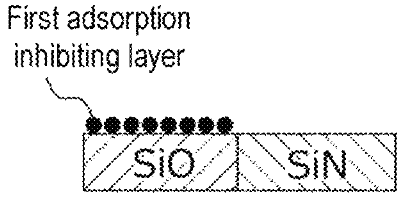
Figure 8C:
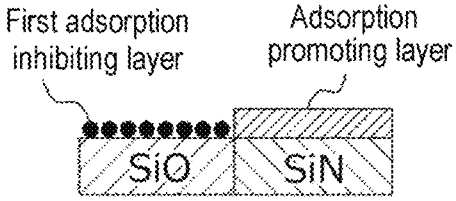
Figure 8D:
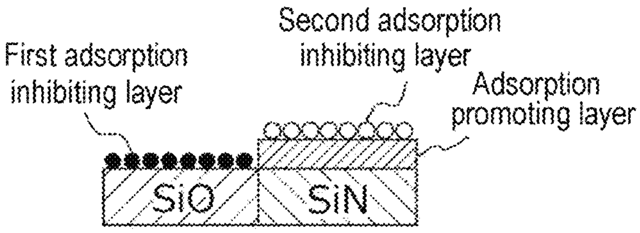
Figure 8E:
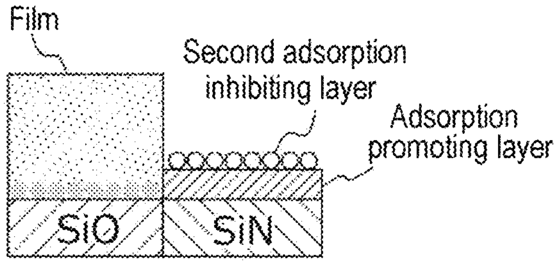
Figure 8F:
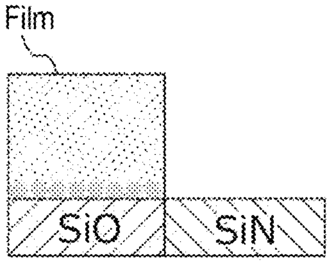

First adsorption-inhibiting layer formation→Adsorption-promoting layer formation→Second adsorption-inhibiting layer formation→Film formation→Second adsorption-inhibiting layer and adsorption-promoting layer removal In step G, it is possible to selectively remove the adsorption-promoting layer and the second adsorption-inhibiting layer on the surface of the second base without removing the film on the surface of the first base, that is, while leaving the film on the surface of the first base, as shown in FIG. 8F. In step G, a difference in processing resistance (etching resistance) due to a difference in material (film type) between the film formed on the surface of the first base and the adsorption-promoting layer formed on the surface of the second base can be used. Due to the difference in processing resistance (etching resistance) between the film formed on the surface of the first base and the adsorption-promoting layer formed on the surface of the second base, it is possible to selectively remove the adsorption-promoting layer and the second adsorption-inhibiting layer on the surface of the second base while leaving the film on the surface of the first base.

Examples of combinations of a type (material) of the adsorption-promoting layer formed on the surface of the second base, a type (material) of the film formed on the surface of the first base, and an etching treatment, which are suitable for step G, are shown below. For example, when forming the SiO layer as the adsorption-promoting layer on the surface of the second base, the SiOC film or the SiN film is formed as the film on the surface of the first base, in which case may perform the etching treatment using a fluorine-based etching agent in step G. Further, for example, when forming the SiOC layer as the adsorption-promoting layer on the surface of the second base, the SiN film is formed as the film on the surface of the first base, in which case may use both plasma oxidation and etching treatment using the fluorine-based etching agent in step G. It is possible to perform the etching after the plasma oxidation changes the adsorption-promoting layer from the SiOC layer to the SiO layer that is easily etched with the fluorine-based etching agent. Examples of the fluorine-based etching agent used as an etching substance may include a HF aqueous solution (DHF), a HF gas, a $F_2$ gas, or the like. The etching substance such as the fluorine-based etching agent can be supplied using the above-described processing substance supply system (the etching substance supply system).

In particular, in the case where the SiO layer is formed as the adsorption-promoting layer on the surface of the second base in step B, the SiOC film is formed as the film on the surface of the first base in step D, and HF is used as the etching substance in step G, it is possible to perform the processing in step G efficiently.

Before step G is performed, as in the above-described processing sequence, steps A, B, C, and D can be performed in the same manner as in the first embodiment. These steps A, B, C, and D can be performed under the same processing procedures and processing conditions as steps A, B, C, and D in the first embodiment.

Further, in Modification 2, before step G is performed, as in the following processing sequence, steps A, B, C, E, and D can be performed in the same manner as in the second embodiment. These steps A, B, C, E, and D can be performed under the same processing procedures and processing conditions as steps A, B, C, E, and D in the second embodiment.

First adsorption-inhibiting layer formation→Adsorption-promoting layer formation→Second adsorption-inhibiting layer formation→First adsorption-inhibiting layer removal and/or invalidation→Film formation→Second adsorption-inhibiting layer and adsorption-promoting layer removal Modification 2 can also obtain the same effects as in the above-described first and second embodiments. Further, according to Modification 2, it is possible to expose the surface of the second base to reset the surface state of the second base. As a result, it is possible to perform desired processing and desired film formation on the surface of the second base in the subsequent various steps.

Modification 3

Modification 3 of the present disclosure will be described mainly with reference to FIGS. 9A to 9G.

As in FIGS. 9A to 9G and a processing sequence shown below, the processing sequence in Modification 3 further includes: after performing step G in Modification 2, step H of modifying the film (which is referred to as "a first film") on the surface of the first base into a film (which is referred to as "a second film") different in material from the film.

Figure 9A:
FIGS. 9A to 9G are schematic cross-sectional views showing a surface portion of a wafer in each step of selective growth according to Modification 3 of the present disclosure.
Figure 9B:
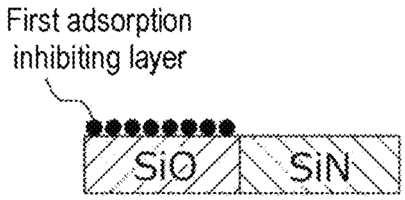
Figure 9C:
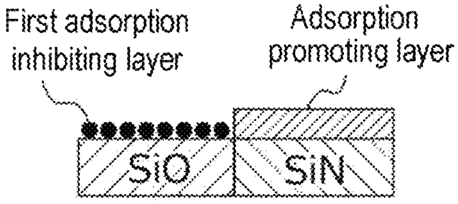
Figure 9D:
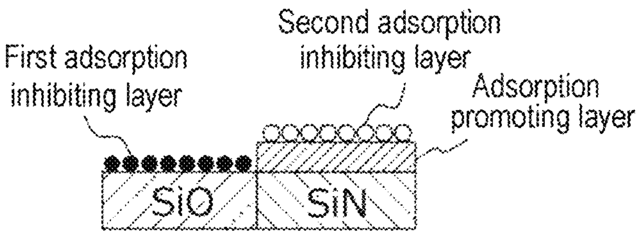
Figure 9E:
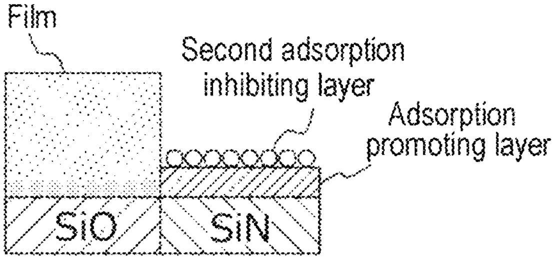
Figure 9F:
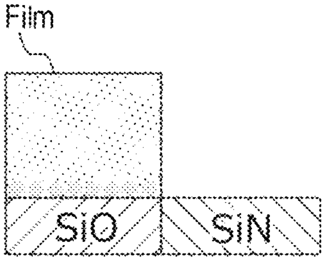
Figure 9G:
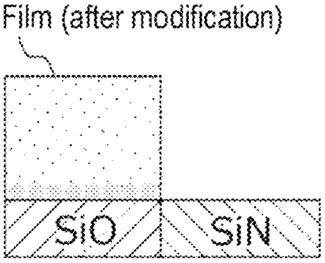

First adsorption-inhibiting layer formation→Adsorption-promoting layer formation→Second adsorption-inhibiting layer formation→Film formation→Second adsorption-inhibiting layer and adsorption-promoting layer removal→Modification In step H, it is possible to modify the film existing on the surface of the first base into a (modified) film different in material from the film after performing step G, as shown in FIG. 9G. For example, it is possible to modify the film existing on the surface of the first base into a film containing the same material as the adsorption-promoting layer, which has been temporarily formed on the surface of the second base, after performing step G. Here, in step D, when the film containing the same material as the adsorption-promoting layer is formed on the surface of the first base, not only the adsorption-promoting layer and the second adsorption-inhibiting layer, but also the film containing the same material as the adsorption-promoting layer is removed together in step G in Modification 2. The film different in material from the adsorption-promoting layer is once formed on the surface of the first base in step D, thereby inhibiting removal of the film different in material from the adsorption-promoting layer in step G, and after that, the film different in material from the adsorption-promoting layer remaining on the surface of the first base can be modified into the film containing the same material as the adsorption-promoting layer. As a result, even after performing step G, it is possible to create a state in which the film containing the same material as the adsorption-promoting layer is formed on the surface of the first base.

In step H, examples of a method of modifying the film on the surface of the first base may include oxidation treatment, nitridation treatment, and the like. In particular, in step H, after performing step G, the film on the surface of the first base may be oxidized and changed into a SiO film. In this case, after performing step G, it is possible to create a state in which the SiO film is formed on the surface of the first base. Here, when the SiO film containing the same material as the adsorption-promoting layer (SiO layer) is formed on the surface of the first base in step D, not only the adsorption-promoting layer (SiO layer) and the second adsorption-inhibiting layer on the surface of the second base, but also the SiO film on the surface of the first base is removed together in step G. The SiOC film different in material from the adsorption-promoting layer (SiO layer) is once formed on the surface of the first base in step D, thereby inhibiting removal of the SiOC film in step G, and after that, the SiOC film remaining on the surface of the first base can be oxidized and changed into the SiO film containing the same material as the adsorption-promoting layer (SiO layer). As a result, even after performing step G, it is possible to create a state in which the SiO film is formed on the surface of the first base In step H, in order to modify the film on the surface of the first base, it may be performed to supply a modifying substance to the wafer 200 and perform annealing treatment in a modifying substance atmosphere. Examples of the modifying substance may include an oxidizing agent (O-containing substance), a nitriding agent (N-containing substance), or the like. The modifying substance can be supplied using the above-described processing substance supply system (the modifying substance supply system).

A processing condition for oxidizing the film on the surface of the first base using the oxidizing agent (O-containing substance) and changing it into the SiO film in step H is exemplified as follows.

Processing temperature: 300 to 1,200 degrees C., specifically 300 to 700 degrees C.

Processing pressure: 1 to 101,325 Pa, specifically 67 to 101,325 Pa

O-containing substance supply flow rate: 1 to 10 slm

O-containing substance supply time: 1 to 240 minutes, specifically 1 to 120 minutes Other conditions can be the same as the processing condition in step A.

As the O-containing substance used in step H, the same O-containing substance as used in step B can be used. Further, the annealing treatment in step H may be plasma annealing using an O-containing substance excited by plasma.

Further, in Modification 3, before step G is performed, as in the following processing sequence, steps A, B, C, E, and D can be performed in the same manner as in the second embodiment. These steps A, B, C, E, and D can be performed under the same processing procedures and processing conditions as steps A, B, C, E, and D in the second embodiment.

First adsorption-inhibiting layer formation→Adsorption-promoting layer formation→Second adsorption-inhibiting layer formation→First adsorption-inhibiting layer removal and/or invalidation→Film formation→Second adsorption-inhibiting layer and adsorption-promoting layer removal→Modification Other Embodiments of the Present Disclosure The embodiments of the present disclosure have been specifically described above. However, the present disclosure is not limited to the above-described embodiments, and various changes can be made without departing from the gist thereof.

For example, the wafer 200 may include a plurality of types of regions containing different materials as the first base, and may include a plurality of types of regions containing different materials as the second base. The regions constituting the first base and the second base may include, in addition to the above-mentioned SiO film and SiN film, films containing semiconductor elements, such as a SiOCN film, a SiON film, a SiOC film, a SiC film, a SiCN film, a SiBN film, a SiBCN film, a SiBC film, a Si film, a Ge film, a SiGe film, or the like, films containing metal elements, such as a TiN film, a W film, or the like, an amorphous carbon films (a-C film), a single crystal Si(Si wafer), etc. Any region can be used as the first base in a case that it is a region including a surface that can be modified by a first modifying agent (that is, a surface having adsorption sites). On the other hand, any region can be used as the second base in a case that it is a region including a surface that is difficult to be modified by the first modifying agent (that is, a surface that does not have adsorption sites or has few adsorption sites). Even in that case, the same effects as in the above-described embodiments can be obtained.

Recipes used in each process may be prepared individually according to the processing contents and may be stored in the memory 121c via a telecommunication line or the external memory 123. Moreover, at a beginning of each process, the CPU 121a may properly select an appropriate recipe from the recipes stored in the memory 121c according to the processing contents. Thus, it is possible for a single substrate processing apparatus to form films of various kinds, composition ratios, qualities, and thicknesses with enhanced reproducibility. Further, it is possible to reduce an operator's burden and to quickly start each process while avoiding an operation error.

The recipes mentioned above are not limited to newly-prepared ones but may be prepared, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

An example in which a film is formed using a batch-type substrate processing apparatus capable of processing a plurality of substrates at a time has been described in the above-described embodiments and modifications. The present disclosure is not limited to the above-described embodiments, but may be suitably applied, for example, to a case where a film is formed using a single-wafer type substrate processing apparatus capable of processing a single substrate or several substrates at a time. In addition, an example in which a film is formed using a substrate processing apparatus installed with a hot-wall-type process furnace has been described in the above-described embodiments. The present disclosure is not limited to the above-described embodiments, but may be suitably applied to a case where a film is formed using a substrate processing apparatus installed with a cold-wall-type process furnace.

Even in the case of using these substrate processing apparatuses, each process may be performed according to the same processing procedures and processing conditions as those in the above-described embodiments and modifications, and the same effects as the above-described embodiments and modifications can be obtained.

The above-described embodiments and modifications may be used in proper combination. The processing procedures and processing conditions used in this case may be the same as, for example, the processing procedures and processing conditions in the above-described embodiments and modifications.

EXAMPLES

Example 1

As Example 1, a first evaluation sample was prepared by using a wafer in which a SiO film as the first base and a SiN film as the second base were exposed on the surface of the wafer and selectively growing a SiOC film on the surface of the SiO film according to the processing sequence in the above-described Modification 1. The processing conditions in each step when preparing the first evaluation sample were set to predetermined conditions within the range of the processing conditions in each step of the processing sequence of the above-described Modification 1.

Example 2

As Example 2, a second evaluation sample was prepared by using a wafer in which a SiO film as the first base and a SiN film as the second base were exposed on the surface of the wafer and selectively growing a SiOC film on the surface of the SiO film and removing (etching) a adsorption-promoting layer and the like on the surface of the SiN film according to the processing sequence in the above-described Modification 2. The processing conditions in each step when preparing the second evaluation sample was set to predetermined condition within the range of the processing conditions in each step of the processing sequence of the above-described Modification 2.

After the first and second evaluation samples were prepared, the thickness of a film (the thickness of the SiOC film) formed on the SiO film and the thickness of a film (the total thickness of adsorption-promoting layer, second adsorption-inhibiting layer, and SiOC film) formed on the SiN film in each of the evaluation samples were measured. Next, a thickness difference between the thickness of the film formed on the SiO film and the thickness of the film formed on the SiN film (hereinafter simply referred to as film thickness difference) in each evaluation sample was calculated. The larger the film thickness difference, the better the selectivity.

Figure 13:
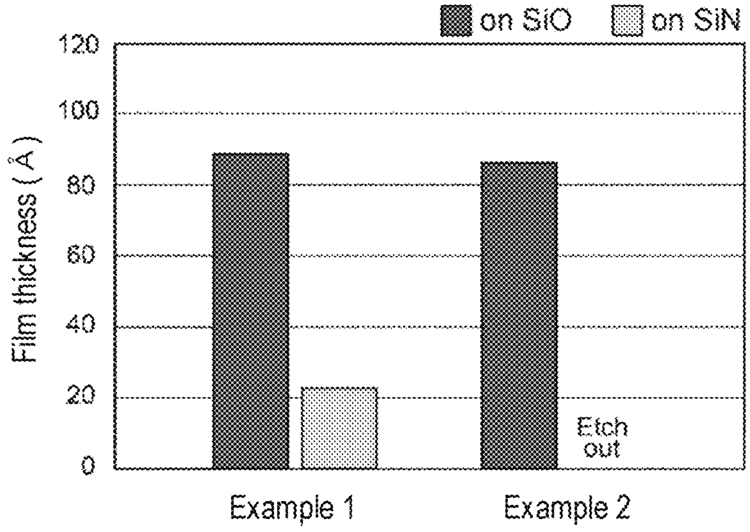
FIG. 13 is a graph showing evaluation results in an Example.

The results are shown in FIG. 13. In FIG. 13, a horizontal axis represents Example 1 (the first evaluation sample) and Example 2 (the second evaluation sample) sequentially from the left side, and a vertical axis represents the thickness (A) of the film formed on each base. In a bar graph, a left bar indicates the thickness of the film (the thickness of the SiOC film) formed on the SiO film, and a right bar indicates the thickness of the film (the total thickness of adsorption-promoting layer, second adsorption-inhibiting layer, and SiOC film) formed on the SiN film.

It can be seen, from FIG. 13, that the film thickness difference in Example 1 (the first evaluation sample) is about 7 nm and the film thickness difference in Example 2 (the second evaluation sample) is about 8.5 nm. Thus, according to Examples 1 and 2, it is confirmed that the selectivity in selective growth can be greatly improved.

Further, in other film formation evaluations conducted by the present disclosers, it is confirmed that a SiOC film is selectively formed on the first base not only when the first base is a SiO film and the second base is a SiN film, but also when the first base is a SiOC film or an AlO film and when the second base is a Si film, a SiCN film, or a metal film such as a TiN film or a W film.

According to the present disclosure in some embodiments, it is possible to selectively form the film on the surface of the desired base by selectively forming the adsorption-inhibiting layer on the surface of the specific base.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A processing method, comprising:

(a) forming a first adsorption-inhibiting layer by adsorbing at least a portion of a molecular structure of molecules constituting a first precursor on a surface of a first base by supplying the first precursor to a substrate including the first base and a second base on a surface of the substrate;

(b) forming an adsorption-promoting layer on a surface of the second base by supplying a reactant to the substrate;

(c) forming a second adsorption-inhibiting layer by adsorbing at least a portion of a molecular structure of molecules constituting a second precursor on a surface of the adsorption-promoting layer by supplying the second precursor, which is different in molecular structure from the first precursor, to the substrate; and (d) forming a first film on the surface of the first base by supplying a film-forming substance to the substrate subjected to (a), (b), and (c) to thereby invalidate an action of the first adsorption-inhibiting layer by an action of the film-forming substance.

2. A processing method, comprising:

(a) forming a first adsorption-inhibiting layer by adsorbing at least a portion of a molecular structure of molecules constituting a first precursor on a surface of a first base by supplying the first precursor to a substrate including the first base and a second base on a surface of the substrate;

(b) forming an adsorption-promoting layer on a surface of the second base by supplying a reactant to the substrate;

(c) forming a second adsorption-inhibiting layer by adsorbing at least a portion of a molecular structure of molecules constituting a second precursor on a surface of the adsorption-promoting layer by supplying the second precursor, which is different in molecular structure from the first precursor, to the substrate;

(d) forming a first film on the surface of the first base by supplying a film-forming substance to the substrate subjected to (a), (b), and (c); and (e) performing at least one selected from the group of removing the first adsorption-inhibiting layer and invalidating an action of the first adsorption-inhibiting layer, after performing (a), (b), and (c) and before performing (d).

3. A method of manufacturing a semiconductor device comprising the processing method of claim 2.

4. The processing method of claim 1, wherein an adsorption-inhibiting action of the first adsorption-inhibiting layer is weaker than an adsorption-inhibiting action of the second adsorption-inhibiting layer under a same condition.

5. The processing method of claim 1, wherein the first adsorption-inhibiting layer is more easily desorbed than the second adsorption-inhibiting layer under a same condition.

6. The processing method of claim 1, wherein a reactivity between the film-forming substance and the first adsorption-inhibiting layer is higher than a reactivity between the film-forming substance and the second adsorption-inhibiting layer under a same condition.

7. The processing method of claim 1, wherein in (b), an oxygen-containing layer is formed as the adsorption-promoting layer.

8. The processing method of claim 7, wherein in (b), the oxygen-containing layer is deposited on the surface of the second base.

9. The processing method of claim 7, wherein in (b), the surface of the second base is oxidized.

10. The processing method of claim 7, wherein a thickness of the adsorption-promoting layer is set to be 0.5 nm or more and 10 nm or less.

11. A processing method, comprising:

(a) forming a first adsorption-inhibiting layer by adsorbing at least a portion of a molecular structure of molecules constituting a first precursor on a surface of a first base by supplying the first precursor to a substrate including the first base and a second base on a surface of the substrate;

(b) forming an adsorption-promoting layer on a surface of the second base by supplying a reactant to the substrate;

(c) forming a second adsorption-inhibiting layer by adsorbing at least a portion of a molecular structure of molecules constituting a second precursor on a surface of the adsorption-promoting layer by supplying the second precursor, which is different in molecular structure from the first precursor, to the substrate;

(d) forming a first film on the surface of the first base by supplying a film-forming substance to the substrate subjected to (a), (b), and (c); and (f) decreasing adsorption sites on the surface of the first base, before performing (a).

12. The processing method of claim 11, wherein in (c), a formation of the second adsorption-inhibiting layer on the surface of the first base is inhibited, by decreasing the adsorption sites on the surface of the first base in (f).

13. The processing method of claim 11, wherein in (f), the substrate is annealed under a temperature of 200 degrees C. or more and 500 degrees C. or less.

14. A method of manufacturing a semiconductor device comprising the processing method of claim 11.

15. The processing method of claim 1, wherein the first film formed on the surface of the first base in (d) is different in material from the adsorption-promoting layer, and wherein the processing method further comprises: (g) removing the adsorption-promoting layer and the second adsorption-inhibiting layer on the surface of the second base by exposing the first film on the surface of the first base and the adsorption-promoting layer and the second adsorption-inhibiting layer on the surface of the second base to an etching substance, after performing (d).

16. The processing method of claim 15, wherein in (b), a silicon oxide layer is formed as the adsorption-promoting layer on the surface of the second base, wherein in (d), a silicon oxycarbide film is formed as the first film on the surface of the first base, and wherein in (g), hydrogen fluoride is used as the etching substance.

17. The processing method of claim 16, further comprising: (h) changing the first film on the surface of the first base into a silicon oxide film by oxidizing the first film, after performing (g).

18. The processing method of claim 15, further comprising: (h) changing the first film on the surface of the first base into a second film different in material from the first film by modifying the first film, after performing (g).

19. The processing method of claim 1, wherein the first base is an oxygen-containing film, and wherein the second base is an oxygen-free film.

20. The processing method of claim 1, wherein the first base is at least one selected from the group of a silicon oxide film, a silicon oxycarbide film, and an aluminum oxide film, and wherein the second base is at least one selected from the group of a silicon film, a silicon nitride film, and a metal film.

21. A method of manufacturing a semiconductor device comprising the processing method of claim 1.

* * * * *